(12) United States Patent
Wada et al.

(10) Patent No.: US 8,610,131 B2
(45) Date of Patent: Dec. 17, 2013

(54) SILICON CARBIDE INSULATED-GATE BIPOLAR TRANSISTOR

(75) Inventors: Keiji Wada, Osaka (JP); Takeyoshi Masuda, Osaka (JP); Misako Honaga, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/435,863

(22) Filed: Mar. 30, 2012

(65) Prior Publication Data

US 2012/0248462 A1   Oct. 4, 2012

Related U.S. Application Data

(60) Provisional application No. 61/469,799, filed on Mar. 30, 2011.

(30) Foreign Application Priority Data

Mar. 30, 2011   (JP) ................................. 2011-073943

(51) Int. Cl.
*H01L 29/15*   (2006.01)
(52) U.S. Cl.
USPC .............. 257/77; 257/E21.054; 257/E21.382; 257/E197
(58) Field of Classification Search
USPC ............ 257/77, E21.054, E21.382, E29.027, 257/E21.065, 197; 438/270, 133, 931
See application file for complete search history.

(56) References Cited

U.S. PATENT DOCUMENTS

| 7,615,849 B2 * | 11/2009 | Nakamura et al. ............. 257/628 |
| 7,982,239 B2 * | 7/2011 | McNutt et al. ................. 257/133 |
| 8,264,047 B2 * | 9/2012 | Schmidt ......................... 257/396 |
| 2005/0258493 A1 | 11/2005 | Aono et al. |
| 2011/0156096 A1 * | 6/2011 | Udrea et al. ................... 257/141 |
| 2011/0180813 A1 * | 7/2011 | Harada et al. ................... 257/77 |

FOREIGN PATENT DOCUMENTS

| JP | 2002-261275 A | 9/2002 |
| JP | 2005-317751 | 11/2005 |
| JP | 2006-228901 | 8/2006 |
| JP | 2010-040564 | 2/2010 |
| WO | WO-2010/116886 A1 | 10/2010 |

OTHER PUBLICATIONS

Ryu et al., "Critical Issues for MOS Based Power Devices in 4H-SiC," Materials Science Forum, vols. 615-617, pp. 743-748 (2009).

* cited by examiner

*Primary Examiner* — Jarrett Stark
*Assistant Examiner* — Shahed Ahmed
(74) *Attorney, Agent, or Firm* — Venable LLP; Michael A. Sartori; Tamatane J. Aga

(57) ABSTRACT

An IGBT includes a groove provided in a silicon carbide semiconductor layer, a body region of a first conductivity type provided in the silicon carbide semiconductor layer, and an insulating film covering at least a sidewall surface of the groove, the sidewall surface of the groove being a surface having an off angle of 50° or more and 65° or less with respect to a {0001} plane, the sidewall surface of the groove including a surface of the body region, the insulating film being in contact with at least the surface of the body region at the sidewall surface of the groove, and a first conductivity type impurity concentration in the body region being $5 \times 10^{16}$ cm$^{-3}$ or more.

23 Claims, 14 Drawing Sheets

SILICON CARBIDE INSULATED-GATE BIPOLAR TRANSISTOR

BACKGROUND OF THE INVENTION

1. Field of the Invention

The present invention relates to IGBTs, and more particularly to an IGBT capable of achieving increased flexibility in setting a threshold voltage while achieving suppressed reduction in channel mobility.

2. Description of the Background Art

In recent years, the use of silicon carbide as a semiconductor material for a semiconductor device has been studied from the viewpoint of a higher breakdown voltage, loss reduction, the use in a high-temperature environment and the like of the semiconductor device.

Silicon carbide is a wide band gap semiconductor having a wider band gap than that of silicon which has been conventionally and widely used as a semiconductor material for a semiconductor device. By using silicon carbide as a material for a semiconductor device, therefore, a higher breakdown voltage, on-resistance reduction and the like of the semiconductor device can be achieved.

A semiconductor device including silicon carbide as a semiconductor material also has the advantage of exhibiting less performance degradation when used in a high-temperature environment than a semiconductor device including silicon as a semiconductor material.

Of such semiconductor devices including silicon carbide as a semiconductor material, semiconductor devices such as MOSFETs (Metal Oxide Semiconductor Field Effect Transistors) and IGBTs (Insulated Gate Bipolar Transistors), in which the presence or absence of formation of an inversion layer in a channel region is controlled with a prescribed threshold voltage as a boundary to conduct or interrupt a current, have been studied from various angles including adjustment of a threshold voltage and improvement in channel mobility (see Non-Patent Literature 1 (Sei-Hyung Ryu et al., "Critical issues for MOS Based Power Devices in 4H—SiC," Materials Science Forum, 2009, Vols. 615-617, pp. 743-748), for example).

In an N channel IGBT, for example, a p body region of a p conductivity type is formed, and a channel region is formed in the p body region. By increasing the concentration (doping concentration) of a p type impurity (B (boron), Al (aluminum), for example) in the p body region, a threshold voltage can be shifted positive, and the IGBT can be brought closer to a normally off type or made as a normally off type.

In a P channel IGBT, contrary to the N channel IGBT, by increasing the concentration of an n type impurity in an n body region, a threshold voltage can be shifted negative, and the IGBT can be brought closer to a normally off type or made as a normally off type.

Unfortunately, when the threshold voltage is adjusted by increasing the p type impurity concentration in the p body region or the n type impurity concentration in the n body region, channel mobility decreases significantly.

The reason for the significant decrease in channel mobility is that the increase in p type impurity concentration or n type impurity concentration causes noticeable scattering of channel electrons, such as scattering of electrons due to the p type impurity or the n type impurity or scattering of electrons trapped in an interface.

For this reason, the p type impurity concentration in the p body region is set to about $1\times10^{16}$ cm$^{-3}$ to $4\times10^{16}$ cm$^{-3}$, for example. Consequently, it has been difficult to flexibly set a threshold voltage while ensuring sufficient channel mobility in a conventional IGBT, particularly to bring the IGBT closer to a normally off type or make the IGBT as a normally off type to a sufficient degree.

SUMMARY OF THE INVENTION

In view of the above circumstances, an object of the present invention is to provide an IGBT capable of achieving increased flexibility in setting a threshold voltage while achieving suppressed reduction in channel mobility.

The present invention is directed to an IGBT including a silicon carbide substrate of a first conductivity type, a silicon carbide semiconductor layer of a second conductivity type provided on a main surface of the silicon carbide substrate, a groove provided in the silicon carbide semiconductor layer, a body region of the first conductivity type provided in the silicon carbide semiconductor layer, and an insulating film covering at least a sidewall surface of the groove, the sidewall surface of the groove being a surface having an off angle of 50° or more and 65° or less with respect to a {0001} plane, the sidewall surface of the groove including a surface of the body region, the insulating film being in contact with at least the surface of the body region at the sidewall surface of the groove, and a first conductivity type impurity concentration in the body region being $5\times10^{16}$ cm$^{-3}$ or more.

Preferably, the IGBT of the present invention further includes a source region of the second conductivity type provided in the body region, in a region opposite to a side on which the silicon carbide substrate is formed, a source electrode provided on the source region, a gate electrode provided on the insulating film, and a drain electrode provided on the silicon carbide substrate opposite to the main surface, in which the sidewall surface of the groove reaches the silicon carbide semiconductor layer, the sidewall surface of the groove includes the source region, the body region, and the silicon carbide semiconductor layer, and at least a part of the gate electrode faces the surface of the body region at the sidewall surface of the groove with the insulating film interposed therebetween.

Preferably, in the IGBT of the present invention, a planar shape of a surface of the source electrode is a stripe shape or a honeycomb shape.

Preferably, in the IGBT of the present invention, the gate electrode is formed of polysilicon of the first conductivity type or the second conductivity type.

Preferably, in the IGBT of the present invention, the sidewall surface of the groove has an off angle of −3° or more and 5° or less with respect to a {03-38} plane in a <01-10> direction.

Preferably, in the IGBT of the present invention, an angle formed between an off orientation of the main surface of the silicon carbide substrate and a <01-10> direction is 5° or less.

Preferably, in the IGBT of the present invention, an angle formed between an off orientation of the main surface of the silicon carbide substrate and a <−2110> direction is 5° or less.

Preferably, in the IGBT of the present invention, the main surface of the silicon carbide substrate is a main surface on a carbon face side of silicon carbide forming the silicon carbide substrate.

Preferably, in the IGBT of the present invention, the first conductivity type impurity concentration in the body region is $1\times10^{20}$ cm$^{-3}$ or less.

Preferably, in the IGBT of the present invention, the first conductivity type impurity concentration in the body region is $8\times10^{16}$ cm$^{-3}$ or more and $3\times10^{18}$ cm$^{-3}$ or less.

Preferably, in the IGBT of the present invention, a thickness of the insulating film is 25 nm or more and 70 nm or less.

Preferably, in the IGBT of the present invention, the first conductivity type is a p type, and the second conductivity type is an n type.

Preferably, the IGBT of the present invention is of normally off type.

Preferably, in the IGBT of the present invention, a threshold voltage at which an inversion layer is formed in the surface of the body region in contact with the insulating film is 2 V or more within a temperature range of 27° C. or more and 100° C. or less.

Preferably, in the IGBT of the present invention, the threshold voltage is 3 V or more at 100° C.

Preferably, in the IGBT of the present invention, the threshold voltage is 1 V or more at 200° C.

Preferably, in the IGBT of the present invention, temperature dependence of the threshold voltage is −10 mV/° C. or more.

Preferably, in the IGBT of the present invention, channel mobility of electrons at 25° C. is 30 $cm^2$/Vs or more.

Preferably, in the IGBT of the present invention, channel mobility of electrons at 100° C. is 50 $cm^2$/Vs or more.

Preferably, in the IGBT of the present invention, channel mobility of electrons at 150° C. is 40 $cm^2$/Vs or more.

Preferably, in the IGBT of the present invention, temperature dependence of channel mobility of electrons is −0.3 $cm^2$/Vs °C. or more.

Preferably, in the IGBT of the present invention, a barrier height at an interface between the body region and the insulating film is 2.2 eV or more and 2.6 eV or less.

Preferably, in the IGBT of the present invention, in an on state, channel resistance, which is a resistance value of a channel region formed in the body region, is smaller than drift resistance, which is a resistance value of the silicon carbide semiconductor layer other than the channel region.

In view of the above circumstances, an object of the present invention is to provide an IGBT capable of achieving increased flexibility in setting a threshold voltage while achieving suppressed reduction in channel mobility.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
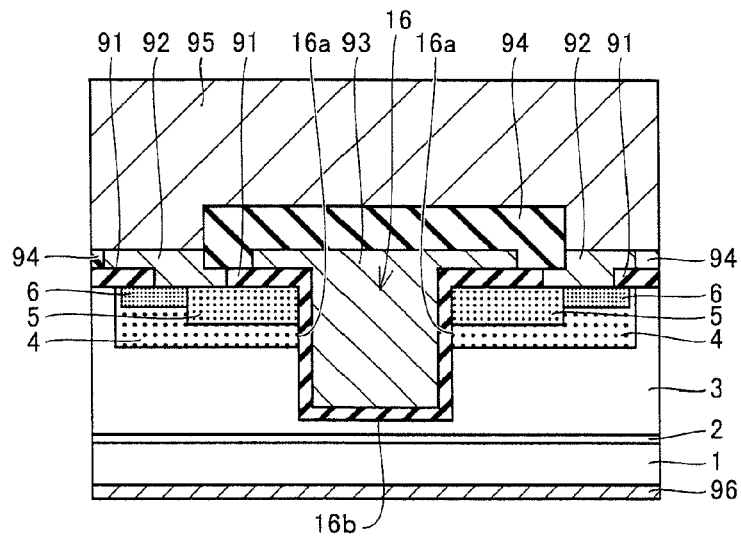
FIG. 1 is a schematic cross sectional view of an IGBT in a first embodiment.

Embodiments of the present invention will now be described. It is to be noted that the same reference signs represent the same or corresponding parts in the drawings of the present invention. Although a bar should properly be attached atop a numeral to indicate a crystallographic plane or orientation, due to limitations in expression, a sign "–" is attached before a numeral in the present specification instead of attaching a bar atop the numeral.

<First Embodiment>

FIG. 1 is a schematic cross sectional view of an IGBT in a first embodiment, which is an example of an IGBT of the present invention. The IGBT in the first embodiment includes a p+ type silicon carbide substrate 1 made of p type silicon carbide, an n+ type electric field stop layer 2 made of n type silicon carbide and provided on p+ type silicon carbide substrate 1, an n– type drift layer 3 made of n type silicon carbide and provided on n+ type electric field stop layer 2, a pair of p body regions 4 made of p type silicon carbide and provided on n– type drift layer 3, a pair of n+ source regions 5 made of n type silicon carbide and provided in p body regions 4, respectively, and a pair of p+ regions 6 made of p type silicon carbide and provided adjacent to n+ source regions 5 in p body regions 4, respectively. N– type drift layer 3 is provided with a groove 16, which includes sidewall surfaces 16a reaching n– type drift layer 3, and a bottom surface 16b formed of n– type drift layer 3. Sidewall surface 16a of groove 16 includes n+ source region 5, p body region 4, and n– type drift layer 3 in this order.

An insulating film 91 is provided in contact with sidewall surfaces 16a and bottom surface 16b of groove 16, and a part of upper surfaces of n+ source regions 5. Insulating film 91 is also provided, at both ends of the IGBT, in contact with upper surfaces of p+ regions 6, p body regions 4, and n– type drift layer 3, respectively.

A gate electrode 93 is provided on and in contact with insulating film 91 covering sidewall surfaces 16a and bottom surface 16b of groove 16, and the upper surfaces of n+ source regions 5. Gate electrode 93 is provided to face a surface of p body region 4 at sidewall surface 16a of groove 16, with insulating film 91 interposed therebetween.

In addition, a source electrode 92 is provided in contact with a part of the upper surfaces of n+ source regions 5 and a part of the upper surfaces of p+ regions 6, respectively. Further, a drain electrode 96 is provided on p+ type silicon carbide substrate 1 opposite to a main surface of p+ type silicon carbide substrate 1.

Furthermore, an interlayer insulating film 94 is provided to cover gate electrode 93, and a source line 95 is provided to cover source electrode 92 and interlayer insulating film 94. Interlayer insulating film 94 is also provided on portions of insulating film 91 in contact with end portions of source electrode 92.

In the IGBT of the first embodiment, each of sidewall surfaces 16a of groove 16 is a surface having an off angle of 50° or more and 65° or less with respect to a {0001} plane, and a p type impurity concentration in p body regions 4 is set to $5 \times 10^{16}$ $cm^{-3}$ or more. In the IGBT of the first embodiment, therefore, the flexibility in setting a threshold voltage can be increased while the reduction in channel mobility is suppressed.

The present inventors conducted a detailed study of methods for increasing the flexibility in setting a threshold voltage while suppressing the reduction in channel mobility, and arrived at the present invention based on the following findings.

A conventional trench type IGBT including silicon carbide as a semiconductor material is fabricated by forming epitaxial growth layers such as an n+ type electric field stop layer and an n– type drift layer on a main surface of a p+ type silicon carbide substrate having an off angle of about 8° or less with respect to the {0001} plane, and forming a groove in the epitaxial growth layers which has sidewall surfaces perpendicular to the main surface of the p+ type silicon carbide substrate.

In such a conventional trench type IGBT, a p body region at each of the sidewall surfaces of the groove serves as a channel region. In the conventional trench type IGBT, however, p type impurity concentration in the p body regions is increased in order to flexibly set the threshold voltage. For this reason, sufficient channel mobility cannot be ensured in the p body regions having the high p type impurity concentration.

However, the study by the present inventors found that, if a surface of p body region 4 serving as a channel region at sidewall surface 16a of groove 16 is a surface having an off angle of 50° or more and 65° or less with respect to the {0001} plane as with the IGBT in the first embodiment, the threshold voltage can be adjusted with increased flexibility and significant reduction in channel mobility can be suppressed, even if p body region 4 has a high p type impurity concentration of $5 \times 10^{16}$ $cm^{-3}$ or more.

Thus, in the IGBT of the first embodiment, the reduction in channel mobility can be suppressed even if the threshold voltage is shifted positive. According to the IGBT of the first embodiment, therefore, an IGBT capable of achieving increased flexibility in setting a threshold voltage while achieving suppressed reduction in channel mobility can be provided. It is to be noted that "impurity" mentioned above refers to an impurity introduced into silicon carbide to generate majority carriers.

N+ type electric field stop layer 2 and n– type drift layer 3 are epitaxially grown in this order on one main surface of p+ type silicon carbide substrate 1, for example, and each of them is of the n conductivity type by containing an n type impurity.

For example, N (nitrogen) is employed as the n type impurity contained in each of n+ type electric field stop layer 2 and n– type drift layer 3. The n type impurity concentration in n– type drift layer 3 is lower than the n type impurity concentration in n+ type electric field stop layer 2.

The pair of p body regions 4 is formed apart from and to face each other with groove 16 formed in n– type drift layer 3 interposed therebetween, and is of the p conductivity type by containing a p type impurity. For example, aluminum (Al) and/or boron (B) is employed as the p type impurity contained in p type body regions 4.

The p type impurity concentration in p body regions 4 is set to $5 \times 10^{16}$ $cm^{-3}$ or more, as described above. Even if p body regions 4 have the high p type impurity concentration of $5 \times 10^{16}$ $cm^{-3}$ or more and the threshold voltage is shifted positive, the reduction in channel mobility can be suppressed. To further shift the threshold voltage positive, the p type impurity concentration in p type body regions 4 is preferably set to $1\times10^{17}$ cm$^{-3}$ or more, and more preferably set to $5\times10^{17}$ cm$^{-3}$ or more.

The p type impurity concentration in p body regions 4 is preferably $1\times10^{20}$ cm$^{-3}$ or less. When the p type impurity concentration in p body regions 4 is $1\times10^{20}$ cm$^{-3}$ or less, it is likely that the degradation in crystallinity in p body regions 4 can be suppressed.

The p type impurity concentration in p body regions 4 is preferably $8\times10^{16}$ cm$^{-3}$ or more and $3\times10^{18}$ cm$^{-3}$ or less. When the p type impurity concentration in p body regions 4 is $8\times10^{16}$ cm$^3$ or more and $3\times10^{18}$ cm$^{-3}$ or less, it is likely that a threshold voltage of about 0 to 5 V can be obtained at a normal operating temperature. As a result, it is likely that the IGBT in the first embodiment can be used in place of a conventional IGBT including silicon as a semiconductor material, and the IGBT in the first embodiment can be made as a normally off type with stability. It is also likely that significant reduction in channel mobility resulting from the increase in p type impurity concentration can be avoided.

The pair of p+ regions 6 is formed in the pair of p body regions 4, respectively, such that the upper surfaces of p+ regions 6 are adjacent to the upper surfaces of n+ source regions 5. Each of p+ regions 6 is formed in a region opposite to groove 16, relative to each of n+ source regions 5. The p type impurity concentration in p+ regions 6 is higher than the p type impurity concentration in p body regions 4.

The pair of n+ source regions 5 is provided such that their upper surfaces are exposed at regions of the pair of p body regions 4, respectively, opposite to the side on which p+ type silicon carbide substrate 1 is formed. The pair of n+ source regions 5 is formed apart from and to face each other with groove 16 formed in n– type drift layer 3 interposed therebetween, and is of the n conductivity type by containing an n type impurity. For example, P (phosphorus) is employed as the n type impurity contained in n+ source regions 5.

Each of sidewall surfaces 16a of groove 16 preferably has an off angle of –3° or more and 5° or less with respect to a {03-38} plane in a <01-10> direction. In this case, it is likely that the channel mobility can be further improved. The reason that the off angle with respect to the plane orientation {03-38} is set to –3° or more and 5° or less is based on examination results of the relation between the channel mobility and the off angle, which showed that a particularly high channel mobility was obtained within this range.

In addition, "off angle with respect to the {03-38} plane in the <01-10> direction" refers to an angle formed between an orthogonal projection of a normal of sidewall surface 16a of groove 16 to a plane including the <01-10> direction and a <0001> direction and a normal of the {03-38} plane, and a sign thereof is positive when the orthogonal projection approaches to become parallel to the <01-10> direction, and negative when the orthogonal projection approaches to become parallel to the <0001> direction.

Sidewall surface 16a of groove 16 is more preferably substantially the {03-38} plane, and is further preferably completely the {03-38} plane. In this case, it is likely that the channel mobility can be further improved. That the surface is "substantially the {03-38} plane" means that sidewall surface 16a of groove 16 is within a range of an off angle where it can be regarded as substantially the {03-38} plane, and the range of the off angle in this case is a range of ±2° of the off angle with respect to the {03-38} plane. That the surface is "completely the {03-38} plane" means that sidewall surface 16a of groove 16 completely matches the {03-38} plane.

Insulating film 91 is formed to extend from the upper surface of one of n+ source regions 5 to the upper surface of the other n+ source region 5, through one of sidewall surfaces 16a, bottom surface 16b and the other sidewall surface 16a of groove 16. Insulating film 91 is made of silicon dioxide (SiO$_2$), for example.

The thickness of insulating film 91 is preferably 25 nm or more and 70 nm or less. When the thickness of insulating film 91 is 25 nm or more and 70 nm or less, it is likely that the occurrence of breakdown can be suppressed during the operation of the IGBT in the first embodiment, and a gate voltage applied to gate electrode 93 can be suppressed low.

Gate electrode 93 is formed in contact with insulating film 91, which extends from the upper surface of one of n+ source regions 5 to the upper surface of the other n+ source region 5, through one of sidewall surfaces 16a, bottom surface 16b and the other sidewall surface 16a of groove 16.

Gate electrode 93 is formed of a conductor such as polysilicon including an n type impurity or a p type impurity, or Al, for example, and is particularly preferably formed of p type polysilicon. When gate electrode 93 is formed of p type polysilicon, it is likely that the threshold voltage can readily be shifted positive, and the IGBT in the first embodiment can be made as a normally off type. For example, polysilicon where the majority carriers are holes can be employed as the p type polysilicon. When polysilicon including an n type impurity or a p type impurity is used for gate electrode 93, gate electrode 93 can be fabricated by adding an n type impurity such as phosphorus or arsenic to polysilicon to a concentration of $1\times10^{18}$ cm$^{-3}$ or more and $1\times10^{21}$ cm$^{-3}$ or less, desirably to a concentration of $5\times10^{19}$ cm$^{-3}$ or more and $5\times10^{20}$ cm$^{-3}$ or less, and then activating the n type impurity, or by adding a p type impurity such as boron to polysilicon to a concentration of $1\times10^{18}$ cm$^{-3}$ or more and $1\times10^{21}$ cm$^{-3}$ or less, desirably to a concentration of $5\times10^{19}$ m$^{-3}$ or more and $5\times10^{20}$ cm$^{-3}$ or less, and then activating the p type impurity.

Source electrode 92 extends from the upper surface of n+ source region 5 in a direction away from groove 16, and reaches an upper surface of insulating film 91 provided on the upper surface of p+ region 6, through the upper surface of p+ region 6.

Source electrode 92 is made of a material capable of making ohmic contact with n$^+$ source regions 5, such as Ni$_x$Si$_y$ (nickel silicide).

A planar shape of the surface of source electrode 92 is preferably a stripe shape or a honeycomb shape. If the planar shape of the surface of source electrode 92 is a stripe shape or a honeycomb shape, it is likely that stable operating characteristics can be obtained with little effect of anisotropy of mobility of channel electrons or electrons in a bulk, and loss reduction can be achieved by increasing channel charge.

Drain electrode 96 is formed in contact with a main surface of p+ type silicon carbide substrate 1 opposite to the surface on which n– type drift layer 3 is formed. Drain electrode 96 is made of a material capable of making ohmic contact with p+ type silicon carbide substrate 1, such as Ni$_x$Si$_y$ or a TiAlSi alloy, and electrically connected to p+ type silicon carbide substrate 1.

Next, the operation of the IGBT in the first embodiment will be described. Referring to FIG. 1, when a voltage applied to gate electrode 93 is lower than a threshold voltage, i.e., in an off state, a pn junction between each of p type body regions 4 and each of n+ source regions 5 positioned immediately below insulating film 91 is reverse biased and a current is not conducted even if a voltage is applied to drain electrode 96.

On the other hand, when a voltage equal to or higher than the threshold voltage is applied to gate electrode 93, an inversion layer is formed in the channel region in each of p type body regions 4 in contact with insulating film 91. As a result, n+ source regions 5, p body regions 4, and n− type drift layer 3 are electrically connected to one another, causing a current to flow between source electrode 92 and drain electrode 96.

In the IGBT of the first embodiment, the surface of p body region 4 serving as the channel region at sidewall surface 16a of groove 16 is a surface having an off angle of 50° or more and 65° or less with respect to the {0001} plane. Accordingly, the reduction in mobility of carriers (electrons) (channel mobility) in the channel region can be suppressed even if p body region 4 has a high p type impurity concentration of $5 \times 10^{16}$ cm$^{-3}$ or more and the threshold voltage is shifted positive. Therefore, the IGBT in the first embodiment can be brought closer to a normally off type or made as a normally off type by shifting the threshold voltage positive while suppressing the reduction in channel mobility.

A threshold voltage at which an inversion layer is formed in the surface of p body region 4 in contact with insulating film 91 is preferably 2 V or more within a temperature range of 25° C. or more and 100° C. or less. In this case, it is likely that the IGBT can be maintained in a normally off state more reliably at a normal operating temperature.

The threshold voltage is preferably 3 V or more at a temperature of 100° C. In this case, it is likely that the IGBT can be maintained in a normally off state more reliably at a high operating temperature.

The threshold voltage is preferably 1 V or more at a temperature of 200° C. In this case, it is likely that the IGBT can be maintained in a normally off state more reliably at a high operating temperature.

The temperature dependence of the threshold voltage is preferably −10 mV/° C. or more. In this case, it is likely that the IGBT can be maintained in a normally off state with more stability. In the present specification, "temperature dependence of the threshold voltage" refers to a ratio of the amount of change in threshold voltage to the amount of change in operating temperature of the IGBT ((the amount of change in threshold voltage)/(the amount of change in operating temperature of the IGBT)).

The channel mobility of electrons at 25° C. is preferably 30 cm$^2$/Vs or more. In this case, it is likely that the on-resistance of the IGBT can be sufficiently suppressed.

The channel mobility of electrons at 100° C. is preferably 50 cm$^2$/Vs or more. In this case, it is likely that the on-resistance of the IGBT can be sufficiently suppressed at a high operating temperature.

The channel mobility of electrons at 150° C. is preferably 40 cm$^2$Ns or more. In this case, it is likely that the on-resistance of the IGBT can be sufficiently suppressed at a higher operating temperature.

The temperature dependence of the channel mobility of electrons is preferably −0.3 cm$^2$Ns ° C. or more. In this case, it is likely that the on-resistance of the IGBT can be suppressed with more stability. In the present specification, "temperature dependence of the channel mobility of electrons" refers to a ratio of the amount of change in channel mobility of electrons to the amount of change in operating temperature of the IGBT ((the amount of change in channel mobility of electrons)/(the amount of change in operating temperature of the IGBT)).

A barrier height at an interface between p type body region 4 and insulating film 91 is preferably 2.2 eV or more and 2.6 eV or less. In this case, it is likely that high channel mobility can be ensured while a leak current is suppressed. In the present specification, "barrier height" refers to the size of a band gap between a conduction band of p body region 4 and a conduction band of insulating film 91.

The channel resistance is preferably smaller than the drift resistance. In this case, it is likely that the on-resistance of the IGBT can be sufficiently suppressed. In the present specification, "channel resistance" refers to a resistance value of the channel region formed in p body region 4 in an on state. Further, in the present specification, "drift resistance" refers to a resistance value of n− type drift layer 3 other than the channel region in an on state.

Figure 2:
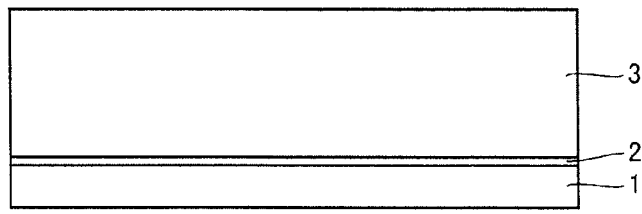
FIG. 2 is a schematic cross sectional view illustrating a part of manufacturing steps in an example of a method of manufacturing the IGBT in the first embodiment.

Referring now to schematic cross sectional views of FIGS. 2 to 7, an example of a method of manufacturing the IGBT in the first embodiment will be described. First, as shown in FIG. 2, n+ type electric field stop layer 2 and n− type drift layer 3 are epitaxially grown in this order on the main surface of p+ type silicon carbide substrate 1.

Here, a surface having a plane orientation perpendicular to a surface having an off angle of 50° or more and 65° or less with respect to the {0001} plane is selected as the main surface of p+ type silicon carbide substrate 1.

Figure 3:
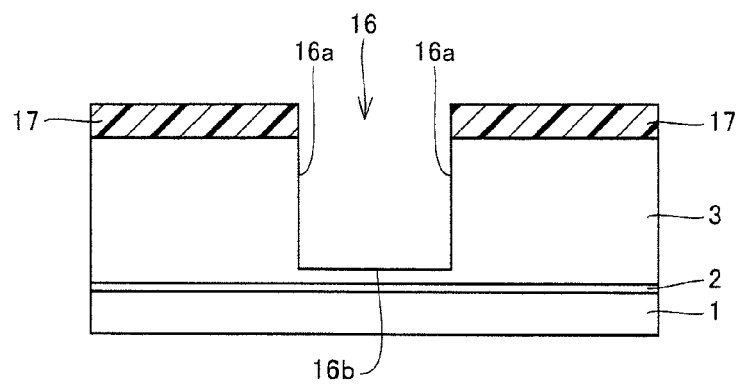
FIG. 3 is a schematic cross sectional view illustrating another part of the manufacturing steps in the example of the method of manufacturing the IGBT in the first embodiment.

Next, as shown in FIG. 3, n− type drift layer 3 is partially removed to form groove 16.

As shown in FIG. 3, groove 16 is formed by forming a mask layer 17 such as a resist on the upper surface of n− type drift layer 3 in a region where groove 16 is not to be formed, and then partially etching n− type drift layer 3 in its thickness direction. As a result, each of sidewall surfaces 16a of groove 16 is a surface having an off angle of 50° or more and 65° or less with respect to the {0001} plane.

The etching may be implemented by reactive ion etching (RIE), for example, and it is particularly preferable to employ inductive coupling plasma (ICP) RIE. The etching may be implemented by ICP-RIE employing $SF_6$ or a mixed gas of $SF_6$ and $O_2$ as a reactive gas, for example. Such etching can form groove 16 having sidewall surfaces 16a substantially perpendicular to the main surface of p+ type silicon carbide substrate 1 in a region where groove 16 is to be formed.

Figure 4:
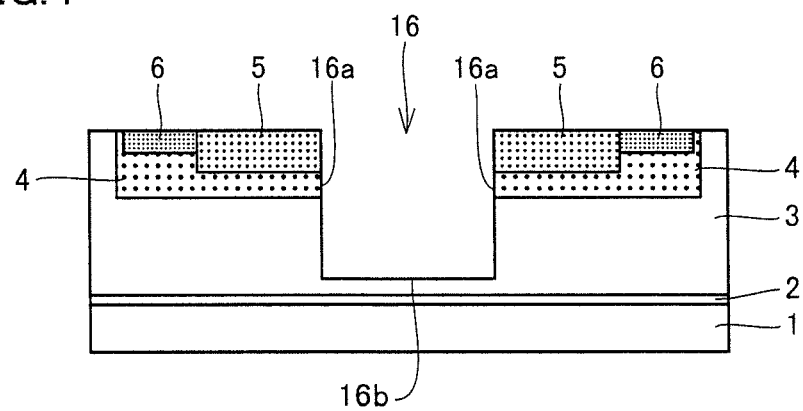
FIG. 4 is a schematic cross sectional view illustrating another part of the manufacturing steps in the example of the method of manufacturing the IGBT in the first embodiment.

Next, as shown in FIG. 4, p body regions 4, n+ source regions 5 and p+ regions 6 are formed in n− type drift layer 3.

P body regions 4, n+ source regions 5 and p+ regions 6 can be manufactured in a manner described below, for example.

First, ion implantation for forming p body regions 4 is performed. Specifically, Al (aluminum) ions are implanted into n− type drift layer 3, for example, to form p body regions 4.

Then, ion implantation for forming n+ source regions 5 is performed. Specifically, P (phosphorus) ions are implanted into p body regions 4, for example, to form n+ source regions 5 in p type body regions 4.

Further, ion implantation for forming p+ regions 6 is performed. Specifically, Al ions are implanted into p body regions 4, for example, to form p+ regions 6 in p body regions 4.

Each of these ion implantations can be performed, for example, by removing mask layer 17, and then forming a mask layer, which is made of silicon dioxide ($SiO_2$) and has an opening in a desired region where the ion implantation should be performed, on the main surface of n− type drift layer 3.

Then, p body regions 4, n+ source regions 5 and p+ regions 6 are subjected to heat treatment. The heat treatment can be conducted, for example, by heating p+ type silicon carbide substrate 1, on which p body regions 4, n+ source regions 5 and p+ regions 6 have been formed, to 1700° C. in an atmosphere of inert gas such as argon, and maintaining it for 30 minutes. As a result, the impurities implanted into p body regions 4, n+ source regions 5 and p+ regions 6 are activated.

Figure 5:
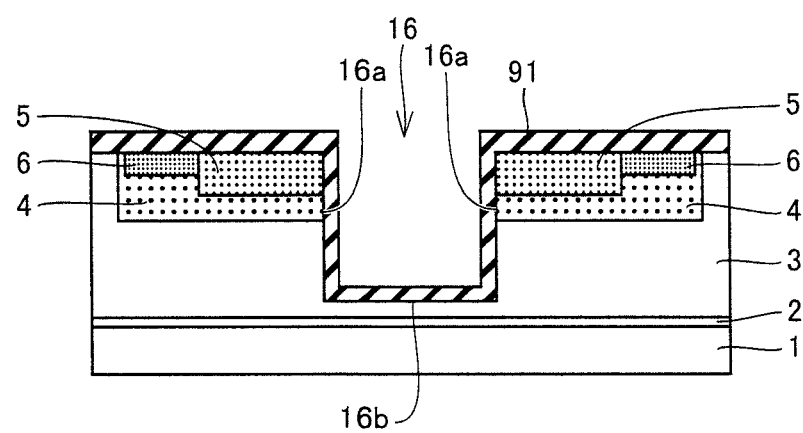
FIG. 5 is a schematic cross sectional view illustrating another part of the manufacturing steps in the example of the method of manufacturing the IGBT in the first embodiment.

Next, as shown in FIG. 5, insulating film 91 is formed. Insulating film 91 can be formed, for example, by heating p+ type silicon carbide substrate 1, which has been subjected to the heat treatment, to 1300° C. in an oxygen atmosphere and maintaining it for 60 minutes.

Next, p+ type silicon carbide substrate 1, on which insulating film 91 has been formed, is subjected to heat treatment in a nitrogen monoxide (NO) gas atmosphere. The condition for this heat treatment may be such that p+ type silicon carbide substrate 1 is maintained in the NO gas atmosphere at a temperature of 1100° C. or more and 1300° C. or less for about one hour, for example.

This heat treatment in the NO gas atmosphere can introduce nitrogen atoms into an interface region between insulating film 91 and p body regions 4. As a result, the formation of an interface state in the interface region between insulating film 91 and each of p body regions 4 can be suppressed, thereby improving the channel mobility in the IGBT.

While the heat treatment is conducted in the NO gas atmosphere in the above description, gases other than the NO gas can of course be employed as long as nitrogen atoms can be introduced into the interface region between insulating film 91 and each of p body regions 4.

Next, p+ type silicon carbide substrate 1, which has been subjected to the heat treatment, is subjected to heat treatment in an Ar (argon) gas atmosphere. The condition for this heat treatment may be such that p+ type silicon carbide substrate 1 is maintained in the Ar gas atmosphere at a temperature higher than the temperature for the heat treatment in the NO gas atmosphere and lower than the melting point of insulating film 91 for about one hour, for example.

As a result, the formation of an interface state in the interface region between insulating film 91 and each of p body regions 4 can be further suppressed, thereby improving the channel mobility in the IGBT.

While the Ar gas is employed as an atmosphere gas in the above description, other inert gases such as nitrogen gas can of course be employed instead of the Ar gas.

In particular, it is preferable that the heat treatment in the Ar gas atmosphere be conducted at a temperature higher than that for the heat treatment in the NO gas atmosphere. As a result, carbon atoms as interstitial atoms remaining in the interface region between insulating film 91 and each of p body regions 4 can be effectively diffused into n− type drift layer 3. Thus, the channel mobility in the IGBT can be further improved.

For example, the temperature for the heat treatment in the NO gas atmosphere may be set to 900° C. or more and 1400° C. or less, and the temperature for the heat treatment in the Ar gas atmosphere may be set higher than that for the heat treatment in the NO gas atmosphere, to 1000° C. or more and 1500° C. or less.

Next, steps of forming gate electrode 93, source electrode 92, interlayer insulating film 94, source line 95 and drain electrode 96 are performed.

In these steps, first, gate electrode 93 made of p type polysilicon is formed by CVD, photolithography and etching, for example. Then, a nickel (Ni) film is formed by evaporation on the back surface of p+ type silicon carbide substrate 1, and the Ni film is then heated and silicidized to form drain electrode 96.

Figure 6:
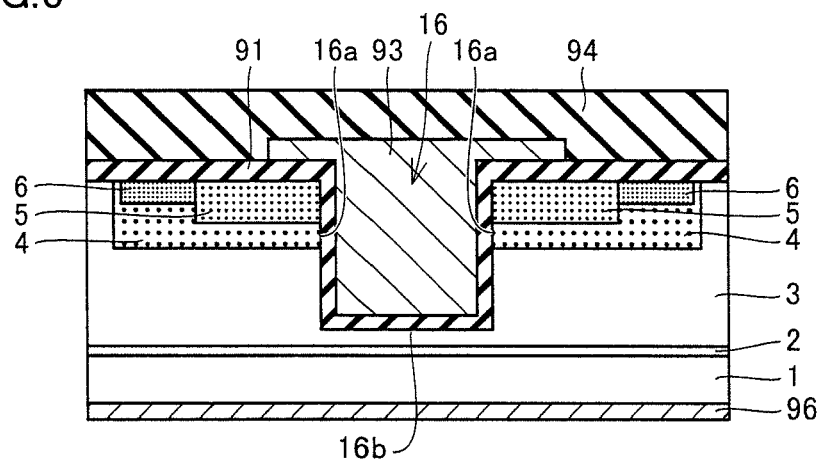
FIG. 6 is a schematic cross sectional view illustrating another part of the manufacturing steps in the example of the method of manufacturing the IGBT in the first embodiment.

Next, as shown in FIG. 6, a step of forming interlayer insulating film 94 to cover gate electrode 93 and insulating film 91 is performed. In this step, interlayer insulating film 94 can be formed by forming a silicon dioxide ($SiO_2$) film to a thickness of about 1 μm by plasma CVD, for example.

Figure 7:
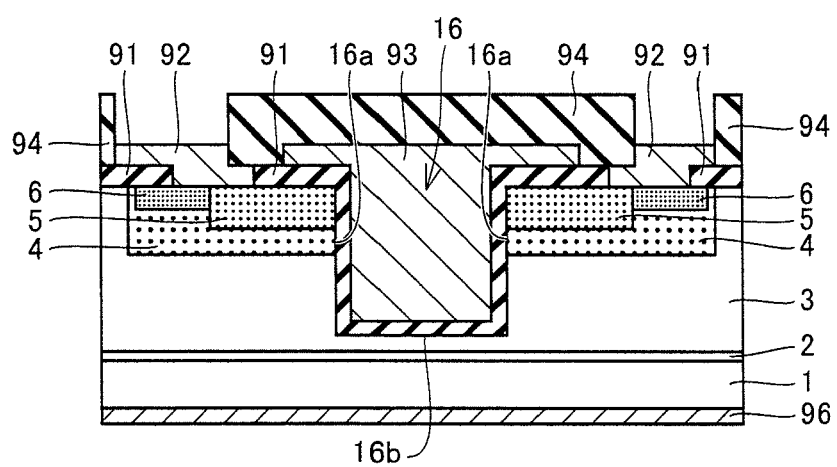
FIG. 7 is a schematic cross sectional view illustrating another part of the manufacturing steps in the example of the method of manufacturing the IGBT in the first embodiment.

Next, as shown in FIG. 7, a step of forming source electrode 92 is performed. In this step, source electrode 92 can be formed by providing an opening partially in interlayer insulating film 94 by photolithography and etching, then forming a nickel (Ni) film by evaporation, and then heating and silicidizing the Ni film, for example.

Next, a step of forming source line 95 to cover source electrode 92 and interlayer insulating film 94 is performed. In this step, source line 95 can be formed by forming an Al film to cover source electrode 92 and interlayer insulating film 94, for example. The IGBT in the first embodiment can be fabricated in this manner.

<Second Embodiment>

Figure 8:
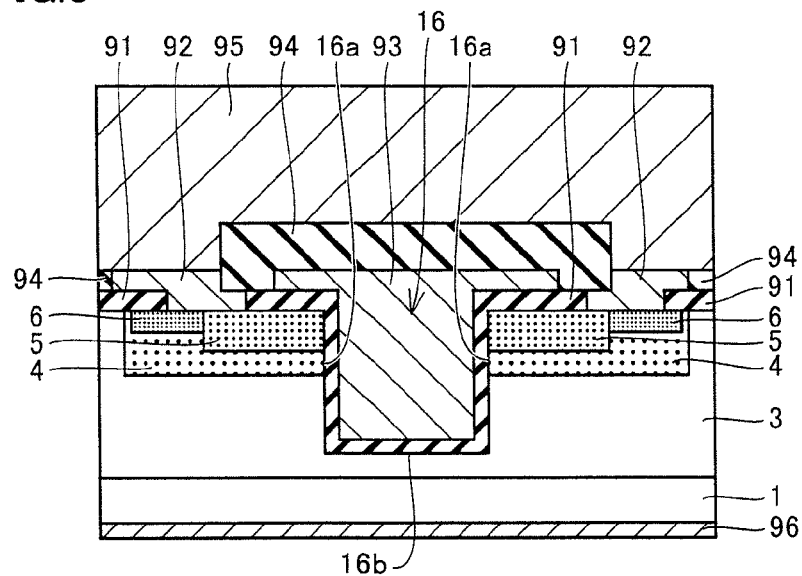
FIG. 8 is a schematic cross sectional view of an IGBT in a second embodiment.

FIG. 8 is a schematic cross sectional view of an IGBT in a second embodiment, which is another example of the IGBT of the present invention. The IGBT in the second embodiment is different from the IGBT in the first embodiment in that n+ type electric field stop layer 2 is not provided on the main surface of p+ type silicon carbide substrate 1.

In the IGBT of the second embodiment, again, the surface of p body region 4 serving as the channel region at sidewall surface 16a of groove 16 is a surface having an off angle of 50° or more and 65° or less with respect to the 100011 plane, and the p type impurity concentration in p body region 4 is $5 \times 10^{16}$ cm$^{-3}$ or more. Therefore, the flexibility in setting a threshold voltage can be increased while significant reduction in channel mobility can be suppressed.

The present embodiment is otherwise similar to the first embodiment, and thus the description thereof will not be repeated.

<Third Embodiment>

Figure 9:
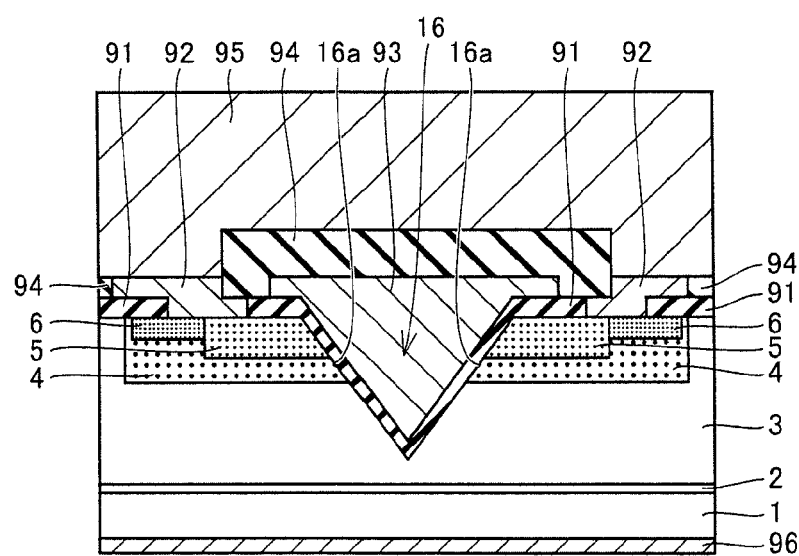
FIG. 9 is a schematic cross sectional view of an IGBT in a third embodiment.

FIG. 9 is a schematic cross sectional view of an IGBT in a third embodiment, which is another example of the IGBT of the present invention. A feature of the IGBT in the third embodiment is that sidewall surfaces 16a of groove 16 are tilted relative to the main surface of p+ type silicon carbide substrate 1.

In the IGBT of the third embodiment, again, the surface of p body region 4 serving as the channel region at sidewall surface 16a of groove 16 is a surface having an off angle of 50° or more and 65° or less with respect to the {0001} plane, and the p type impurity concentration in p body region 4 is $5 \times 10^{16}$ cm$^{-3}$ or more. Therefore, the flexibility in setting a threshold voltage can be increased while significant reduction in channel mobility can be suppressed.

An angle formed between an off orientation of the main surface of p+ type silicon carbide substrate 1 and the <01-10> direction is preferably 5° or less. The <01-10> direction is a representative off orientation of the main surface of p+ type silicon carbide substrate 1. Thus, by setting variations in off orientation resulting from variations during slicing or the like in the course of manufacturing p+ type silicon carbide substrate 1 to 5° or less with respect to the <01-10> direction, it is likely that n+ type electric field stop layer 2 and n− type drift layer 3 can be epitaxially grown on the main surface of p+ type silicon carbide substrate 1 more readily.

An angle formed between the off orientation of the main surface of p+ type silicon carbide substrate 1 and a <−2110> direction is preferably 5° or less. Like the <01-10> direction, the <−2110> direction is a representative off orientation of the main surface of p+ type silicon carbide substrate 1. Thus, by setting variations in off orientation resulting from variations during slicing or the like in the course of manufacturing p+ type silicon carbide substrate 1 to 5° or less with respect to the <−2110> direction, it is likely that n+ type electric field stop layer 2 and n− type drift layer 3 can be epitaxially grown on the main surface of p+ type silicon carbide substrate 1 more readily.

The main surface of p+ type silicon carbide substrate 1 is preferably a main surface on a carbon face side of silicon carbide forming p+ type silicon carbide substrate 1. By employing the main surface on the carbon face side as the main surface of p+ type silicon carbide substrate 1, the tilt (off angle) of the main surface of p+ type silicon carbide substrate 1 after the epitaxial growth of n+ type electric field stop layer 2 and n− type drift layer 3 thereon can be made smaller. This likely leads to a smaller difference in plane orientation between two surfaces facing each other in a cross section of sidewall surfaces 16a of groove 16 tilted relative to the main surface of p+ type silicon carbide substrate 1, for example. It is to be noted that a (0001) plane of single-crystalline silicon carbide of a hexagonal crystal is defined as a silicon face, and a (000-1) plane is defined as a carbon face.

Figure 10:
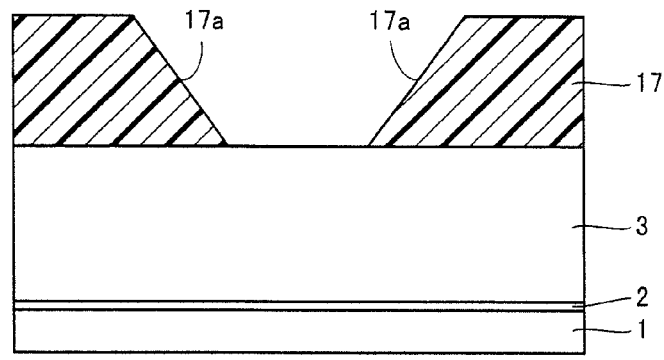
FIG. 10 is a schematic cross sectional view illustrating a part of manufacturing steps in an example of a method of manufacturing the IGBT in the third embodiment.

Referring now to schematic cross sectional views of FIGS. 10 to 15, an example of a method of manufacturing the IGBT in the third embodiment will be described. First, as shown in FIG. 10, n+ type electric field stop layer 2 and n− type drift layer 3 are epitaxially grown in this order on the main surface of p+ type silicon carbide substrate 1, and then mask layer 17 is formed.

Mask layer 17 is formed with tilted surfaces 17a in a portion where groove 16 is to be formed. Tilted surfaces 17a of mask layer 17 are formed such that tilted sidewall surfaces 16a of groove 16 (surfaces each having an off angle of 50° or more and 65° or less with respect to the {0001} plane) will appear by etching of the surface of n− type drift layer 3 to be described later.

Figure 11:
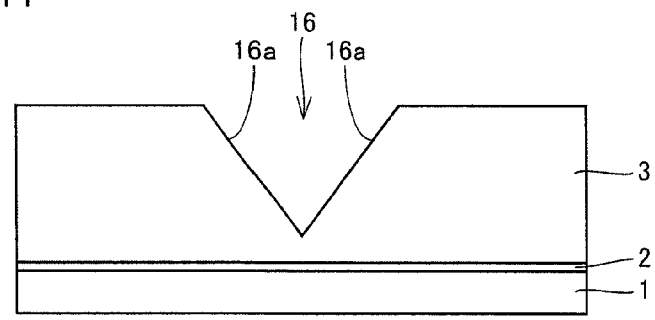
FIG. 11 is a schematic cross sectional view illustrating another part of the manufacturing steps in the example of the method of manufacturing the IGBT in the third embodiment.

Next, n− type drift layer 3 is etched with mask layer 17 having the above-described shape as a mask, to form groove 16 having sidewall surfaces 16a in the surface of n− type drift layer 3, as shown in FIG. 11. Mask layer 17 is then removed. The etching of n− type drift layer 3 may be implemented by dry etching having a high degree of anisotropy or thermal etching, for example.

Figure 12:
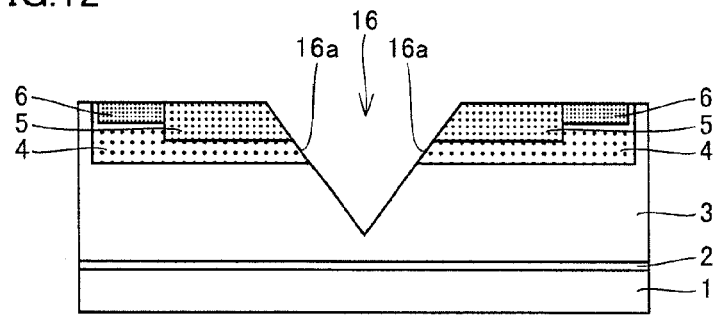
FIG. 12 is a schematic cross sectional view illustrating another part of the manufacturing steps in the example of the method of manufacturing the IGBT in the third embodiment.

Next, as shown in FIG. 12, p body regions 4, n+ source regions 5 and p+ regions 6 are formed in n− type drift layer 3. Then, p body regions 4, n+ source regions 5 and p+ regions 6 are subjected to heat treatment, to activate the impurities in p body regions 4, n+ source regions 5 and p+ regions 6, respectively.

Figure 13:
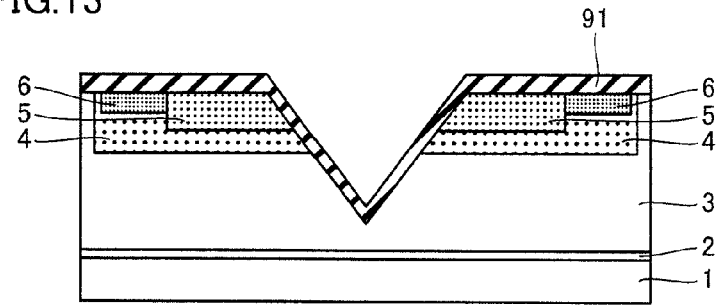
FIG. 13 is a schematic cross sectional view illustrating another part of the manufacturing steps in the example of the method of manufacturing the IGBT in the third embodiment.

Next, as shown in FIG. 13, insulating film 91 is formed. Then, p+ type silicon carbide substrate 1, on which insulating film 91 has been formed, is subjected to heat treatment in an NO gas atmosphere, and p+ type silicon carbide substrate 1 is subsequently subjected to heat treatment in an Ar gas atmosphere.

Next, steps of forming gate electrode 93, source electrode 92, interlayer insulating film 94, source line 95 and drain electrode 96 are performed. Then, a nickel (Ni) film is formed by evaporation on the back surface of p+ type silicon carbide substrate 1, and the Ni film is then heated and silicidized to form drain electrode 96.

Figure 14:
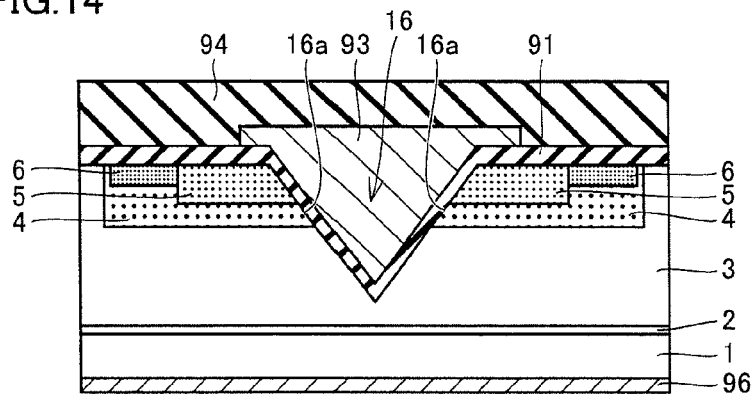
FIG. 14 is a schematic cross sectional view illustrating another part of the manufacturing steps in the example of the method of manufacturing the IGBT in the third embodiment.

Next, as shown in FIG. 14, a step of forming interlayer insulating film 94 to cover gate electrode 93 and insulating film 91 is performed. In this step, interlayer insulating film 94 can be formed by forming a silicon dioxide ($SiO_2$) film to a thickness of about 1 μm by plasma CVD, for example.

Figure 15:
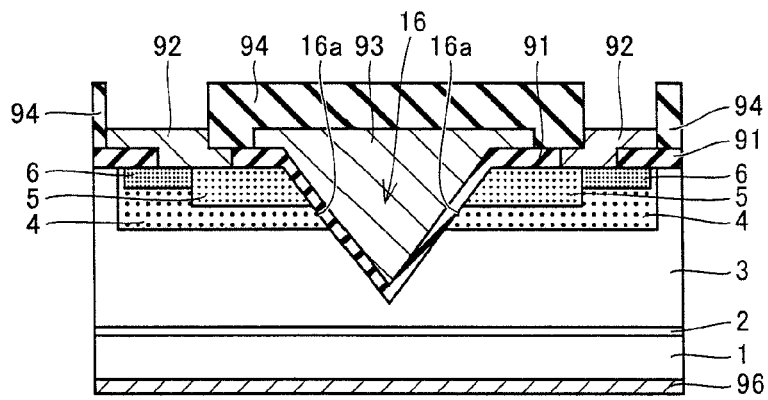
FIG. 15 is a schematic cross sectional view illustrating another part of the manufacturing steps in the example of the method of manufacturing the IGBT in the third embodiment.

Next, as shown in FIG. 15, a step of forming source electrode 92 is performed. In this step, source electrode 92 can be formed by providing an opening partially in interlayer insulating film 94 by photolithography and etching, then forming a nickel (Ni) film by evaporation, and then heating and silicidizing the Ni film, for example.

Next, a step of forming source line 95 to cover source electrode 92 and interlayer insulating film 94 is performed. In this step, source line 95 can be formed by forming an Al film to cover source electrode 92 and interlayer insulating film 94, for example. The IGBT in the third embodiment can be fabricated in this manner.

The present embodiment is otherwise similar to the first and second embodiments, and thus the description thereof will not be repeated.

<Fourth Embodiment>

Figure 16:
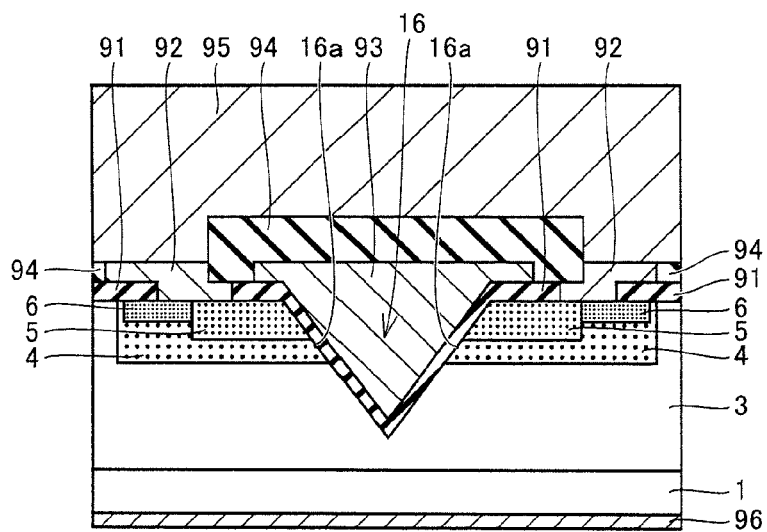
FIG. 16 is a schematic cross sectional view of an IGBT in a fourth embodiment.

FIG. 16 is a schematic cross sectional view of an IGBT in a fourth embodiment, which is another example of the IGBT of the present invention. The IGBT in the fourth embodiment is different from the IGBT in the third embodiment in that n+ type electric field stop layer 2 is not provided on the main surface of p+ type silicon carbide substrate 1.

In the IGBT of the fourth embodiment, again, the surface of p body region 4 serving as the channel region at sidewall surface 16a of groove 16 is a surface having an off angle of 50° or more and 65° or less with respect to the {0001} plane, and the p type impurity concentration in p body region 4 is $5 \times 10^{16}$ $cm^{-3}$ or more. Therefore, the flexibility in setting a threshold voltage can be increased while significant reduction in channel mobility can be suppressed.

The present embodiment is otherwise similar to the first to third embodiments, and thus the description thereof will not be repeated.

<Fifth Embodiment>

Figure 17:
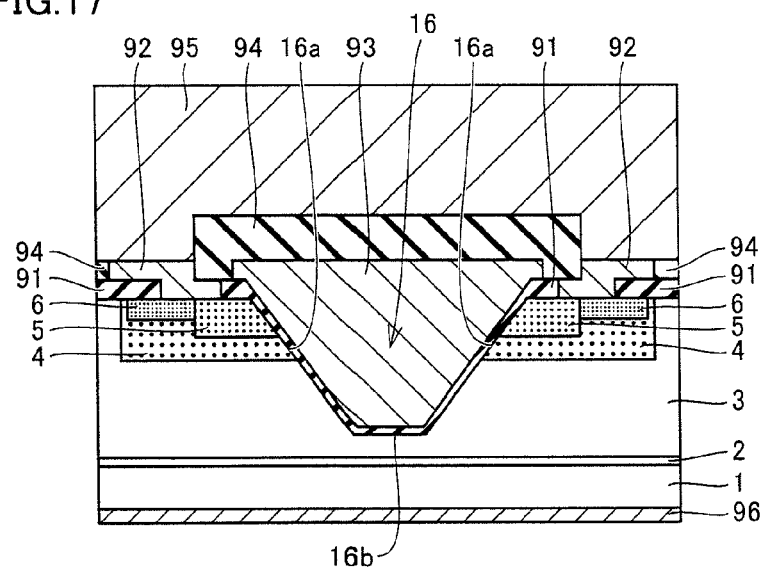
FIG. 17 is a schematic cross sectional view of an IGBT in a fifth embodiment.

FIG. 17 is a schematic cross sectional view of an IGBT in a fifth embodiment, which is another example of the IGBT of the present invention. A feature of the IGBT in the fifth embodiment is that sidewall surfaces 16a of groove 16 are tilted relative to the main surface of p+ type silicon carbide substrate 1, and that bottom surface 16b extending from sidewall surfaces 16a is provided.

In the IGBT of the fifth embodiment, again, the surface of p body region 4 serving as the channel region at sidewall surface 16a of groove 16 is a surface having an off angle of 50° or more and 65° or less with respect to the {0001} plane, and the p type impurity concentration in p body region 4 is $5 \times 10^{16}$ $cm^{-3}$ or more. Therefore, the flexibility in setting a threshold voltage can be increased while significant reduction in channel mobility can be suppressed.

Referring now to the schematic cross sectional views of FIGS. 2 and 18 to 24, an example of a method of manufacturing the IGBT in the fifth embodiment will be described. First, as shown in FIG. 2, n+ type electric field stop layer 2 and n− type drift layer 3 are epitaxially grown in this order on the main surface of p+ type silicon carbide substrate 1.

Figure 18:
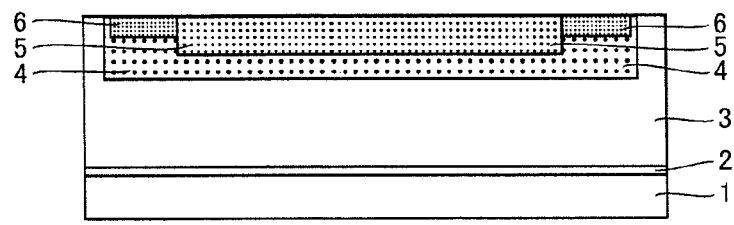
FIG. 18 is a schematic cross sectional view illustrating a part of manufacturing steps in an example of a method of manufacturing the IGBT in the fifth embodiment.

Next, as shown in FIG. 18, p body regions 4, n+ source regions 5 and p+ regions 6 are formed in n− type drift layer 3.

Figure 19:
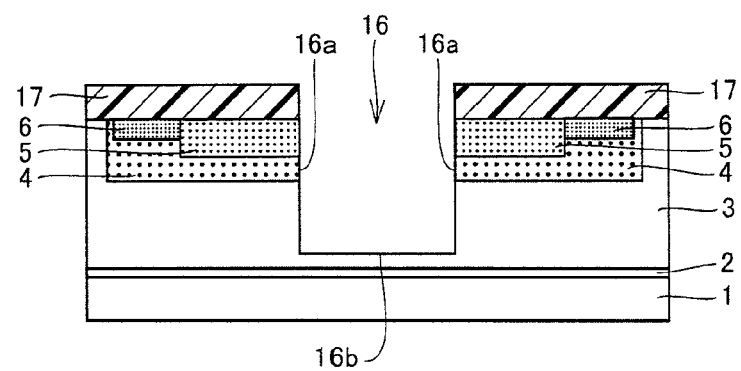
FIG. 19 is a schematic cross sectional view illustrating another part of the manufacturing steps in the example of the method of manufacturing the IGBT in the fifth embodiment.

Next, as shown in FIG. 19, mask layer 17 provided with an opening in a region where groove 16 is to be formed is formed, and then n− type drift layer 3 is partially etched in its thickness direction, to form groove 16.

Figure 20:
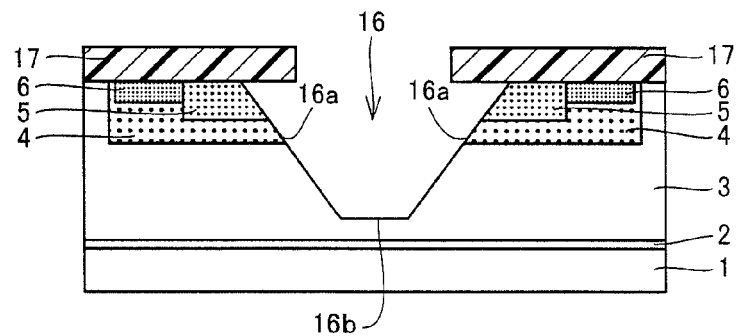
FIG. 20 is a schematic cross sectional view illustrating another part of the manufacturing steps in the example of the method of manufacturing the IGBT in the fifth embodiment.

Next, as shown in FIG. 20, a thermal etching step is performed with mask layer 17 as a mask, such that surfaces each having an off angle of 50° or more and 65° or less with respect to the {0001} plane will appear at sidewall surfaces 16a of groove 16.

In the thermal etching step, etching (thermal etching) of sidewall surfaces 16a of groove 16 shown in FIG. 20 can be performed with a mixed gas of oxygen gas and chlorine gas as a reactive gas, for example, at a heat treatment temperature of 700° C. or more and 1000° C. or less, for example, to form groove 16 having sidewall surfaces 16a tilted relative to the main surface of p+ type silicon carbide substrate 1, as shown in FIG. 20.

In the thermal etching step, a ratio of flow rate of the chlorine gas to the oxygen gas ((flow rate of chlorine gas)/

(flow rate of oxygen gas)) is preferably set to 0.5 or more and 4 or less, and more preferably set to 1 or more and 2 or less.

The mixed gas of oxygen gas and chlorine gas may contain a carrier gas in addition to the oxygen gas and the chlorine gas. For example, at least one type of gas selected from the group consisting of nitrogen ($N_2$) gas, argon gas and helium gas can be employed as the carrier gas.

When the heat treatment temperature in the thermal etching step is set to 700° C. or more and 1000° C. or less as described above, the thermal etching speed is about 70 μm/hr, for example.

Further, when silicon dioxide ($SiO_2$) is used for mask layer 17, an etching selection ratio of silicon carbide to silicon dioxide can be extremely increased. It is thus likely that mask layer 17 made of $SiO_2$ will not be substantially etched in the thermal etching step.

A crystallographic plane that appears at each of sidewall surfaces 16a of groove 16 in the thermal etching step is a {03-3-8} plane, for example. That is, in the thermal etching step, the {03-3-8} plane, which is a crystallographic plane having the slowest etching speed, is self-formed as each of sidewall surfaces 16a of groove 16.

Figure 21:
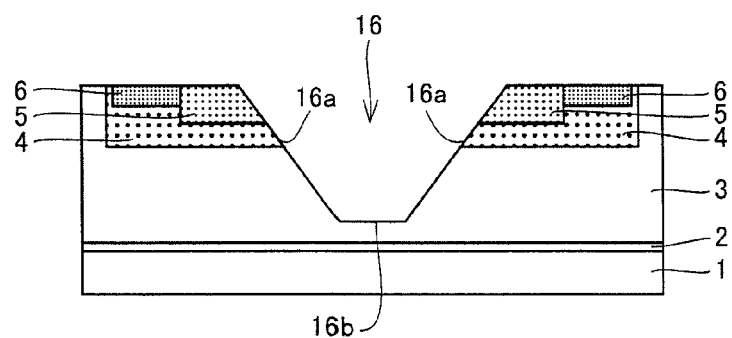
FIG. 21 is a schematic cross sectional view illustrating another part of the manufacturing steps in the example of the method of manufacturing the IGBT in the fifth embodiment.

Next, after mask layer 17 is removed as shown in FIG. 21, p body regions 4, n+ source regions 5 and p+ regions 6 are subjected to heat treatment, to activate the impurities in p body regions 4, n+ source regions 5 and p+ regions 6, respectively.

Figure 22:
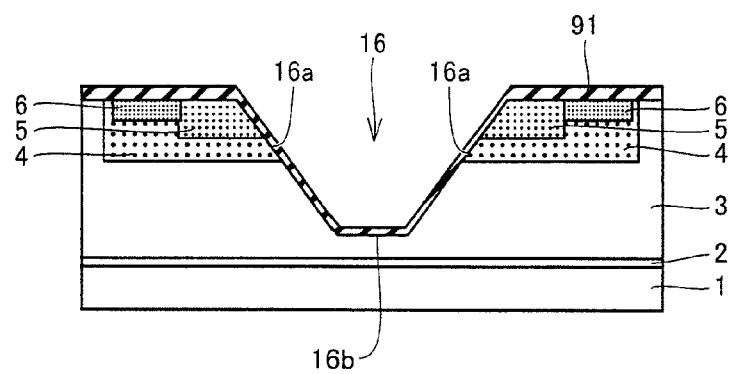
FIG. 22 is a schematic cross sectional view illustrating another part of the manufacturing steps in the example of the method of manufacturing the IGBT in the fifth embodiment.

Next, as shown in FIG. 22, insulating film 91 is formed. Then, p+ type silicon carbide substrate 1, on which insulating film 91 has been formed, is subjected to heat treatment in an NO gas atmosphere, and p+ type silicon carbide substrate 1 is subsequently subjected to heat treatment in an Ar gas atmosphere.

Next, steps of forming gate electrode 93, source electrode 92, interlayer insulating film 94, source line 95 and drain electrode 96 are performed. Then, a nickel (Ni) film is formed by evaporation on the back surface of p+ type silicon carbide substrate 1, and the Ni film is then heated and silicidized to form drain electrode 96.

Figure 23:
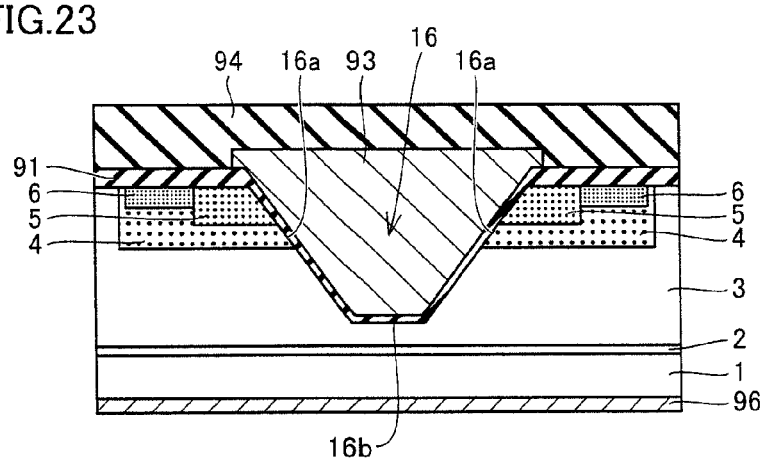
FIG. 23 is a schematic cross sectional view illustrating another part of the manufacturing steps in the example of the method of manufacturing the IGBT in the fifth embodiment.

Next, as shown in FIG. 23, a step of forming interlayer insulating film 94 to cover gate electrode 93 and insulating film 91 is performed. In this step, interlayer insulating film 94 can be formed by forming a silicon dioxide ($SiO_2$) film to a thickness of about 1 μm by plasma CVD, for example.

Figure 24:
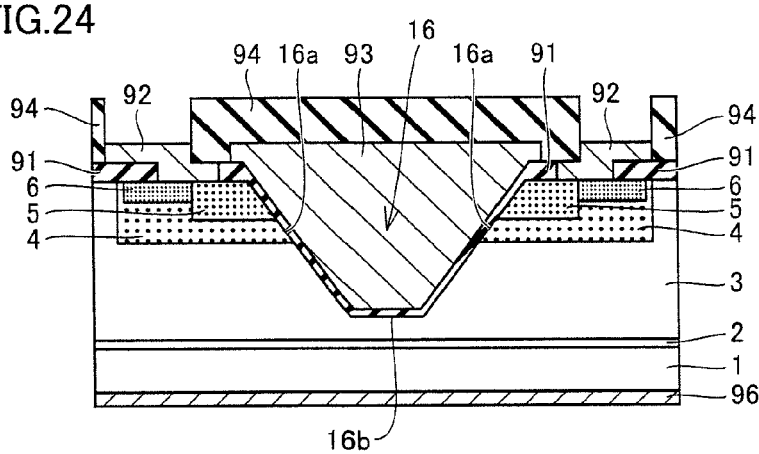
FIG. 24 is a schematic cross sectional view illustrating another part of the manufacturing steps in the example of the method of manufacturing the IGBT in the fifth embodiment.

Next, as shown in FIG. 24, a step of forming source electrode 92 is performed. In this step, source electrode 92 can be formed by providing an opening partially in interlayer insulating film 94 by photolithography and etching, then forming a nickel (Ni) film by evaporation, and then heating and silicidizing the Ni film, for example.

Next, a step of forming source line 95 to cover source electrode 92 and interlayer insulating film 94 is performed. In this step, source line 95 can be formed by forming an Al film to cover source electrode 92 and interlayer insulating film 94, for example. The IGBT in the fifth embodiment can be fabricated in this manner.

The present embodiment is otherwise similar to the first to fourth embodiments, and thus the description thereof will not be repeated.

<Sixth Embodiment>

Figure 25:
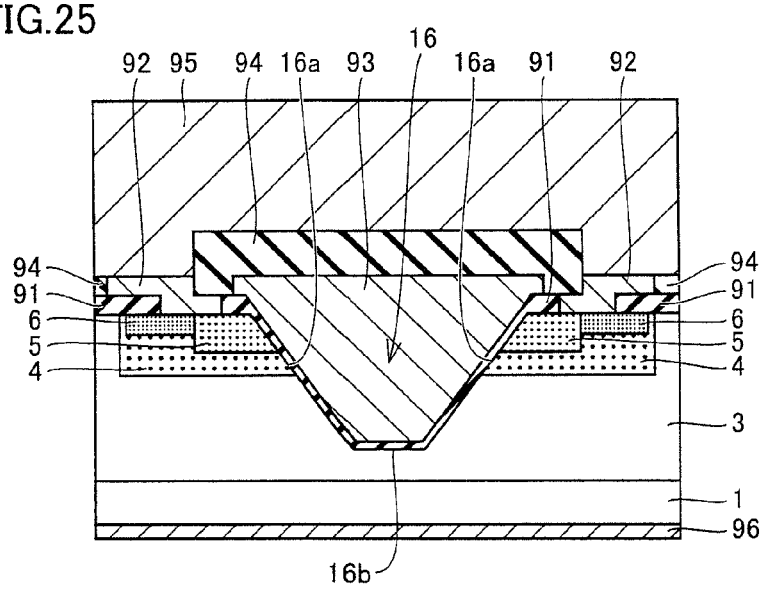
FIG. 25 is a schematic cross sectional view of an IGBT in a sixth embodiment.

FIG. 25 is a schematic cross sectional view of an IGBT in a sixth embodiment, which is another example of the IGBT of the present invention. The IGBT in the sixth embodiment is different from the IGBT in the fifth embodiment in that n+ type electric field stop layer 2 is not provided on the main surface of p+ type silicon carbide substrate 1.

In the IGBT of the sixth embodiment, again, the surface of p body region 4 serving as the channel region at sidewall surface 16a of groove 16 is a surface having an off angle of 50° or more and 65° or less with respect to the {0001} plane, and the p type impurity concentration in p body region 4 is $5 \times 10^{16}$ $cm^{-3}$ or more. Therefore, the flexibility in setting a threshold voltage can be increased while significant reduction in channel mobility can be suppressed.

The present embodiment is otherwise similar to the first to fifth embodiments, and thus the description thereof will not be repeated.

FIRST EXAMPLE

Figure 26:
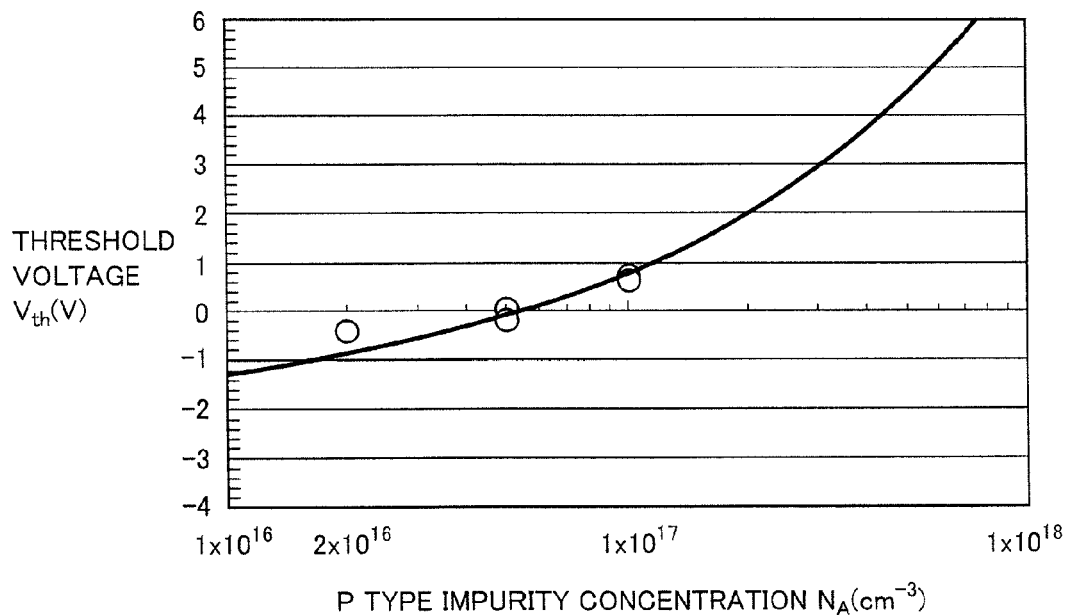
FIG. 26 illustrates the relation between a p type impurity concentration $N_A$ ($cm^{-3}$) in a p body region and a threshold voltage $V_{th}$ (V) in samples of a first example.

Experiments were conducted to confirm the relation between p type impurity concentration in a p body region and a threshold voltage. Specifically, first, experimental IGBTs (samples) in which sidewall surfaces of a groove each had a plane orientation of (03-3-8) were fabricated by a process including an NO annealing step and an Ar annealing step as in the first embodiment. A plurality of samples of varying p type impurity concentrations in a p type body region were fabricated. Then, a threshold voltage was measured for each sample. The results are shown in FIG. 26. In FIG. 26, a horizontal axis represents p type impurity concentration $N_A$ ($cm^{-3}$) in the p body region, and a vertical axis represents a threshold voltage $V_{th}$ (V).

Circles in FIG. 26 represent data points obtained from the experiments. A curve in FIG. 26 is a theoretical curve indicating the relation between the p type impurity concentration in the p body region and the threshold voltage. The theoretical curve corresponds to an expression (1) indicated below. In the expression (1), $n_i$ represents an intrinsic carrier density, $C_{ox}$ represents an oxide film capacity, $\phi_m$ and $\phi_s$ represent work functions of a metal and a semiconductor, respectively, and $\Delta V_{Qeff}$ represents a voltage shift component due to effective fixed charge. In addition, Q represents an elementary charge ($Q=1.6 \times 10^{-19}$ C). From the experimental results, $\Delta V_{Qeff}=1.9$ V was used.

$$V_{th}(N_a) = \frac{\sqrt{2\varepsilon_o\varepsilon_{sic}kTN_a\ln\left(\frac{N_a}{n_i}\right)}}{C_{ox}} + \frac{kT}{Q}\ln\left(\frac{N_a}{n_i}\right) + (\phi_m - \phi_s) + \Delta V_{Qeff} \quad (1)$$

As shown in FIG. 26, the data points obtained from the experiments are distributed along the theoretical curve. It is considered from the results shown in FIG. 26 that, by setting the p type impurity concentration in the p body region to $8 \times 10^{16}$ $cm^{-3}$ or more, a positive threshold voltage is obtained with stability to thereby attain a normally off state.

SECOND EXAMPLE

Experiments were conducted to examine the relation between p type impurity concentration in a p body region and channel mobility. The experimental procedure was as follows.

First, as in the first example, experimental IGBTs (samples) in which sidewall surfaces of a groove each had a plane orientation of (03-3-8) were fabricated by a process including an NO annealing step and an Ar annealing step. A plurality of samples of p type impurity concentrations in the p body region varying within a range of $2 \times 10^{16}$ $cm^{-3}$ to $1 \times 10^{17}$ $cm^{-3}$ were fabricated. An insulating film was formed by heating to 1200 to 1300° C. in an oxygen atmosphere and maintaining it for about 60 minutes. Then, the NO annealing process was performed by heating to 1100 to 1200° C. in an NO atmosphere and maintaining it for about 60 minutes. After that, the Ar annealing process was performed by heating to 1200 to 1300° C. in an Ar atmosphere and maintaining it for about 60 minutes (IGBTs of an example).

For comparison, an IGBT in which sidewall surfaces of a groove each had a plane orientation of (0001) was fabricated (IGBTs of a comparative example).

Figure 27:
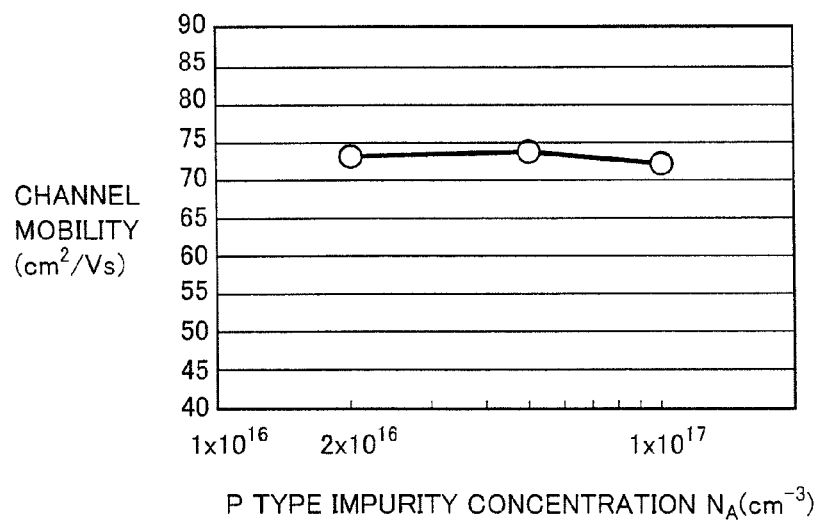
FIG. 27 illustrates the relation between p type impurity concentration $N_A$ ($cm^{-3}$) in the p body region and channel mobility ($cm^2$/Vs) in IGBTs of an example in a second example.
Figure 28:
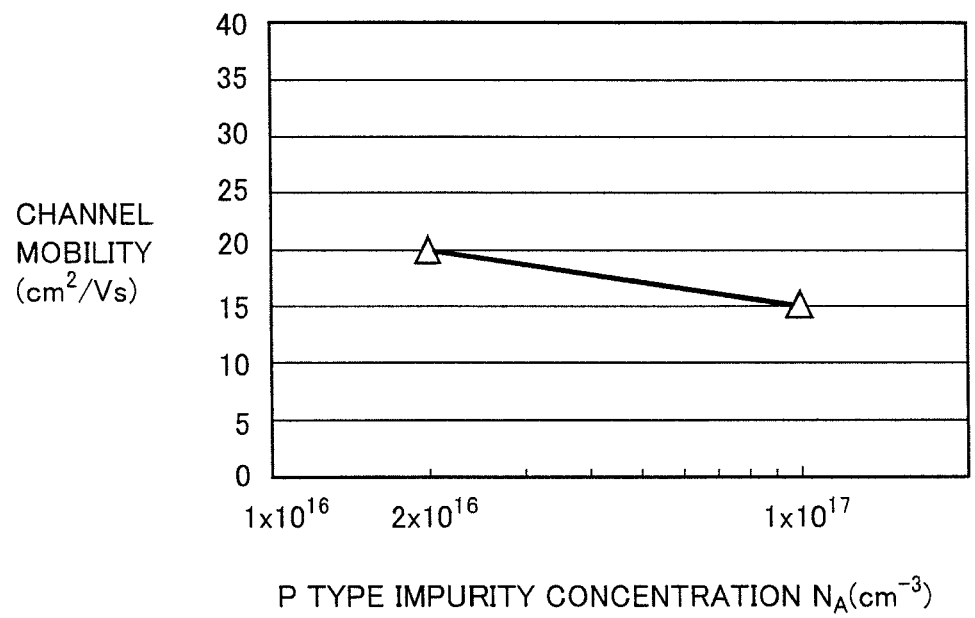
FIG. 28 illustrates the relation between p type impurity concentration $N_A$ ($cm^{-3}$) in the p body region and the channel mobility ($cm^2$/Vs) in an IGBT of a comparative example in the second example.

Then, the channel mobility was measured for each of the IGBTs of the example and the IGBT of the comparative example. FIG. 27 illustrates the relation between the p type impurity concentration in the p body region and the channel mobility in the IGBTs of the example, and FIG. 28 illustrates the relation between the p type impurity concentration in the p body region and the channel mobility in the IGBT of the comparative example. In FIGS. 27 and 28, a horizontal axis represents p type impurity concentration $N_A$ (cm$^{-3}$) in the p type body region, and a vertical axis represents the channel mobility (cm$^2$/Vs).

As shown in FIG. 27, it was confirmed that, in the IGBTs of the example in which the sidewall surfaces of the groove each had the plane orientation of (03-3-8), the channel mobility hardly decreased as the p type impurity concentration in the p body region increased from $2\times10^{16}$ cm$^{-3}$ to $1\times10^{17}$ cm$^{-3}$.

As shown in FIG. 28, on the other hand, it was confirmed that, in the IGBT of the comparative example in which the sidewall surfaces of the groove each had the plane orientation of (0001), the channel mobility decreased by approximately 25% as the p type impurity concentration in the p body region increased from $2\times10^{16}$ cm$^{-3}$ to $1\times10^{17}$ cm$^{-3}$.

As indicated in the vertical axis of FIG. 27 and the vertical axis of FIG. 28, it was also confirmed that the channel mobility in the IGBTs of the example was significantly higher in absolute value than the channel mobility in the IGBT of the comparative example. It can therefore be appreciated that the IGBTs of the example had higher channel mobility than that of the IGBT of the comparative example, with the difference in channel mobility between the IGBTs of the example and the IGBT of the comparative example becoming larger as the p type impurity concentration in the p body region increases.

It was confirmed from these experimental results that, according to the IGBTs of the example, the threshold voltage can be shifted positive while the reduction in channel mobility is suppressed.

THIRD EXAMPLE

Experiments were conducted to examine a threshold voltage of an IGBT of an example. Specifically, first, an experimental IGBT (IGBT of an example) in which sidewall surfaces of a groove each had a plane orientation of (03-3-8) was fabricated as in the first example. Then, a value of the amount of a drain current with a varying gate voltage was measured for the IGBT of the example. The threshold voltage was determined by plotting the amount of the drain current in a log scale and in a linear scale for the same measurement result. A graph created by this plotting is shown in FIG. 29.

Figure 29:
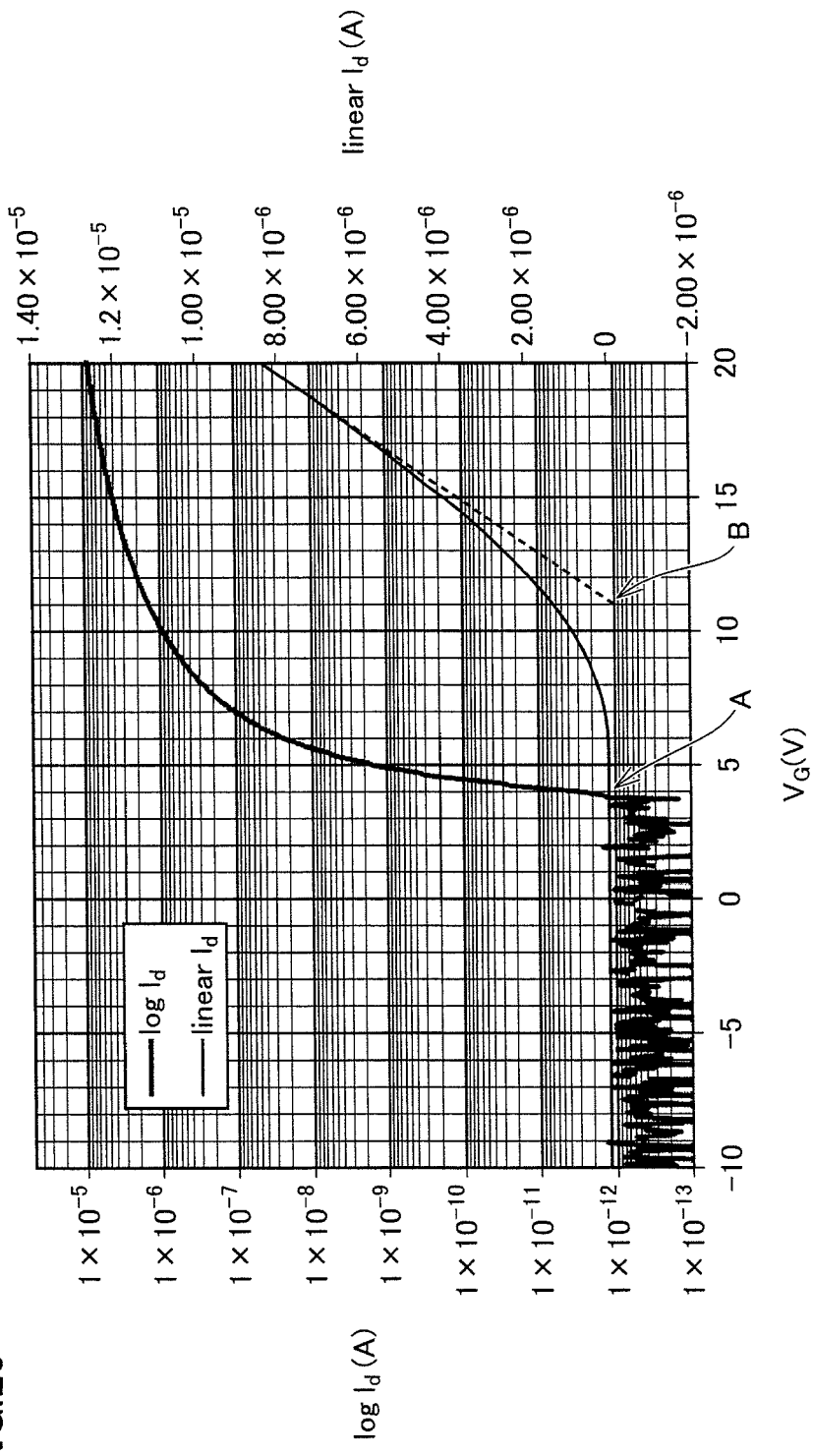
FIG. 29 illustrates the relation between a gate voltage $V_G$ (V), and the amount of a drain current (A) in a log scale and the amount of the drain current (A) in a linear scale in an IGBT of an example in a third example.

In FIG. 29, a horizontal axis represents the gate voltage (VG), a left vertical axis represents the amount of the drain current in the log scale (log $I_d$) (A), and a right vertical axis represents the amount of the drain current in the linear scale (linear $I_d$) (A). In FIG. 29, a thick line represents the amount of the drain current in the log scale (log $I_d$) (A), and a thin line represents the amount of the drain current in the linear scale (linear $I_d$) (A).

As shown in FIG. 29, it was confirmed that a threshold voltage (point A in FIG. 29) obtained from the curve indicating the amount of the drain current in the log scale was smaller than a threshold voltage (point B in FIG. 29) obtained by extending a straight portion of the curve indicating the amount of the drain current in the linear scale.

The threshold voltage obtained from the curve indicating the amount of the drain current in the log scale represents a voltage at which a thin channel region (weak inversion layer) is initially formed in a region in a p type body region in contact with an insulating film as the gate voltage is increased. In the present specification, the gate voltage at which this weak inversion layer is formed is regarded as the threshold voltage.

FOURTH EXAMPLE

Experiments were conducted to examine the temperature dependence of a threshold voltage of IGBTs of examples. Specifically, first, experimental IGBTs (IGBTs of an example) in which sidewall surfaces of a groove each had a plane orientation of (03-3-8) were fabricated as in the first example. Two types of IGBTs having p type impurity (Al) concentration in a p body region of $1\times10^{18}$ cm$^{-3}$ (example A) and $5\times10^{17}$ cm$^{-3}$ (example B), respectively, were fabricated.

Figure 30:
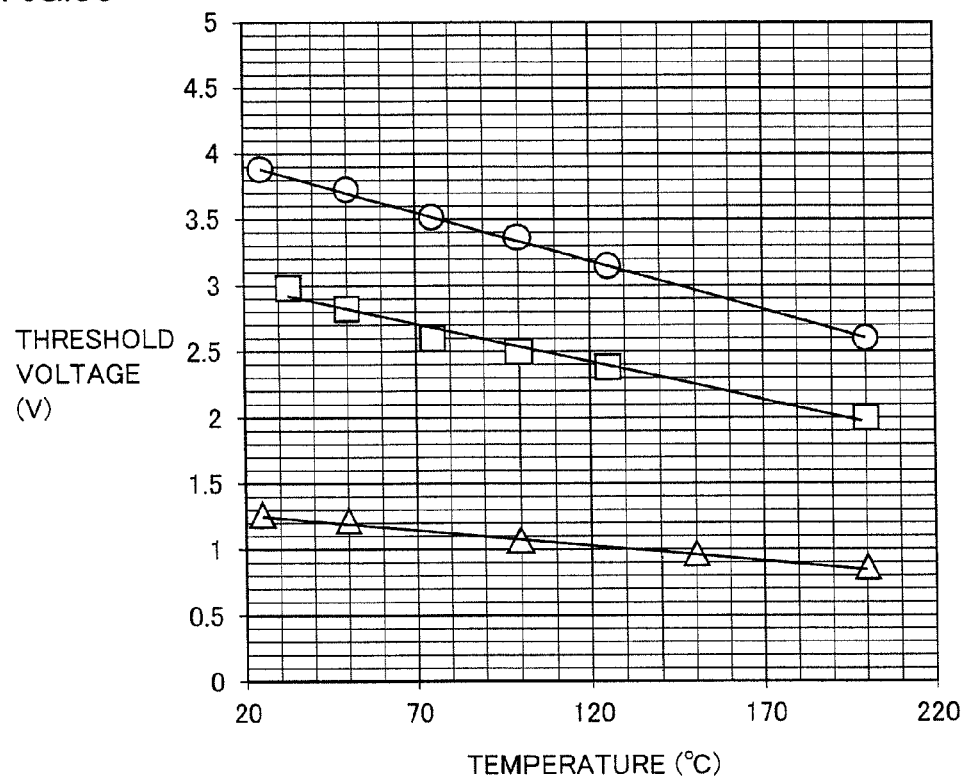
FIG. 30 illustrates the relation between the threshold voltage (V) and temperature (° C.) in IGBTs of examples A, B and comparative example A, respectively, in a fourth example.

For comparison, an experimental IGBT (IGBT of comparative example A) was fabricated as with the IGBTs of the examples, except that sidewall surfaces of a groove each had a plane orientation of (0001). The p type impurity (Al) concentration in the p body region in the IGBT of comparative example A was set to $2\times10^{16}$ cm$^{-3}$. Then, the relation between the threshold voltages of the respective IGBTs of examples A, B and comparative example A and the temperature were examined within a temperature range of room temperature (25° C.) to 200° C. The results are shown in FIG. 30. In FIG. 30, circles indicate the threshold voltage (V) at each temperature (° C.) of the IGBT of example A, squares indicate the threshold voltage (V) at each temperature (° C.) of the IGBT of example B, and triangles indicate the threshold voltage (V) at each temperature (° C.) of the IGBT of comparative example A.

As shown in FIG. 30, it was confirmed that the threshold voltages of the IGBTs of examples A and B were higher than that of the IGBT of comparative example A, which were all 2 V or more within a temperature range of room temperature (25° C.) to 100° C., so that a normally off state can be maintained with stability.

In particular, it was confirmed that the threshold voltage of the IGBT of example A was 3V or more at 100° C. and 1 V or more at 200° C., so that a normally off state can be maintained with stability at a higher temperature.

It was also continued that, in the IGBT of example A and the IGBT of example B, the temperature dependence of the threshold voltage (tilt of an approximate line in the figure) was −7 mV/° C. and −6 mV/° C., respectively, which were both −10 mV/° C. or more.

To explain from another point of view, it was confirmed that, in the IGBT of example A and the IGBT of example B, an absolute value of the temperature dependence of the threshold voltage (tilt of the approximate line in the figure) was 7 mV/° C. and 6 mV/° C., respectively, which were both 10 mV/° C. or less, so that a normally off state can be maintained with stability.

FIFTH EXAMPLE

Experiments were conducted to examine the temperature dependence of channel mobility of electrons in an IGBT of an example. Specifically, first, an experimental IGBT (IGBT of example C) in which sidewall surfaces of a groove each had a plane orientation of (03-3-8) was fabricated as in the first example.

For comparison, an experimental IGBT (IGBT of comparative example B) was fabricated as with the IGBT of the example, except that sidewall surfaces of a groove each had a plane orientation of (0001).

Figure 31:
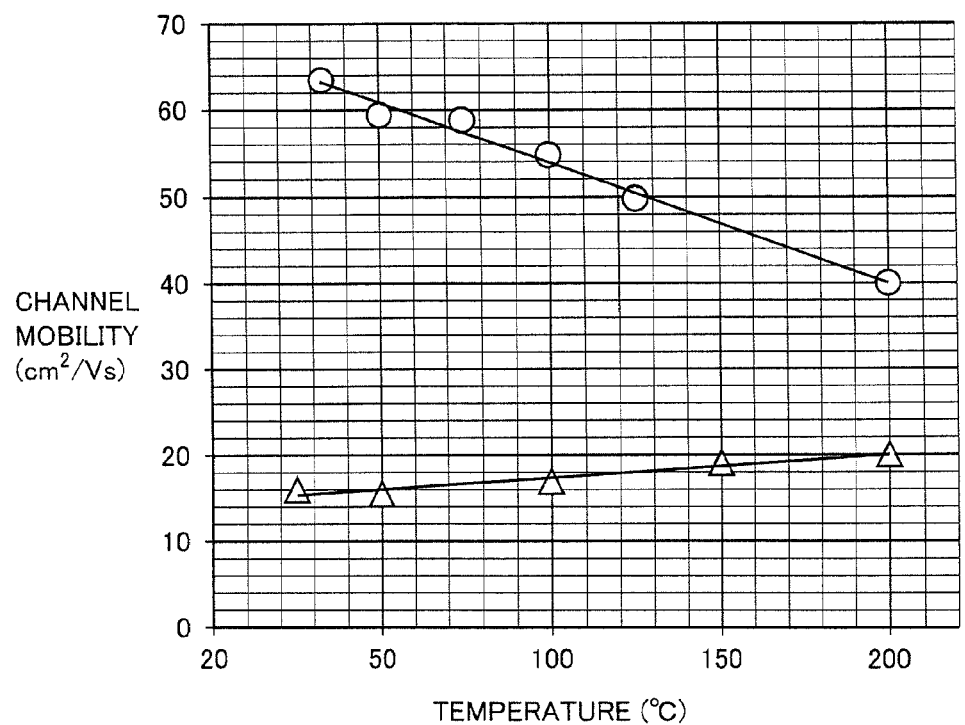
FIG. 31 illustrates the relation between temperature (° C.) and the channel mobility of electrons ($cm^2/Vs$) in IGBTs of example C and comparative example B, respectively, in a fifth example.

Then, the relation between the channel mobility of electrons in the respective IGBTs of example C and comparative example B and the temperature was examined within a temperature range of room temperature (25° C.) to 200° C. The results are shown in FIG. 31. In FIG. 31, circles indicate the channel mobility of electrons ($cm^2/Vs$) at each temperature (° C.) in the IGBT of example C, and triangles indicate the channel mobility of electrons ($cm^2/Vs$) at each temperature (° C.) in the IGBT of comparative example B.

As shown in FIG. 31, it was confirmed that the channel mobility in the IGBT of example C was higher than that in the IGBT of comparative example B, which was 30 $cm^2/Vs$ or more at room temperature (25° C.), and 50 $cm^2/Vs$ or more at 100° C. In addition, it is considered from the results shown in FIG. 31 that the channel mobility in the IGBT of example C is 40 $cm^2/Vs$ or more at 150° C.

As shown in FIG. 31, it was also confirmed that the temperature dependence of channel mobility in the IGBT of example C was about $-0.14$ $cm^2/Vs$ ° C., which was $-0.3$ $cm^2/Vs$ ° C. or more. To explain from another point of view, it was confirmed that an absolute value of the temperature dependence of channel mobility of electrons in the IGBT of example C was 0.3 $cm^2/Vs$ ° C. or less, so that the on-resistance of the IGBT could be suppressed with stability.

SIXTH EXAMPLE

Figure 32:
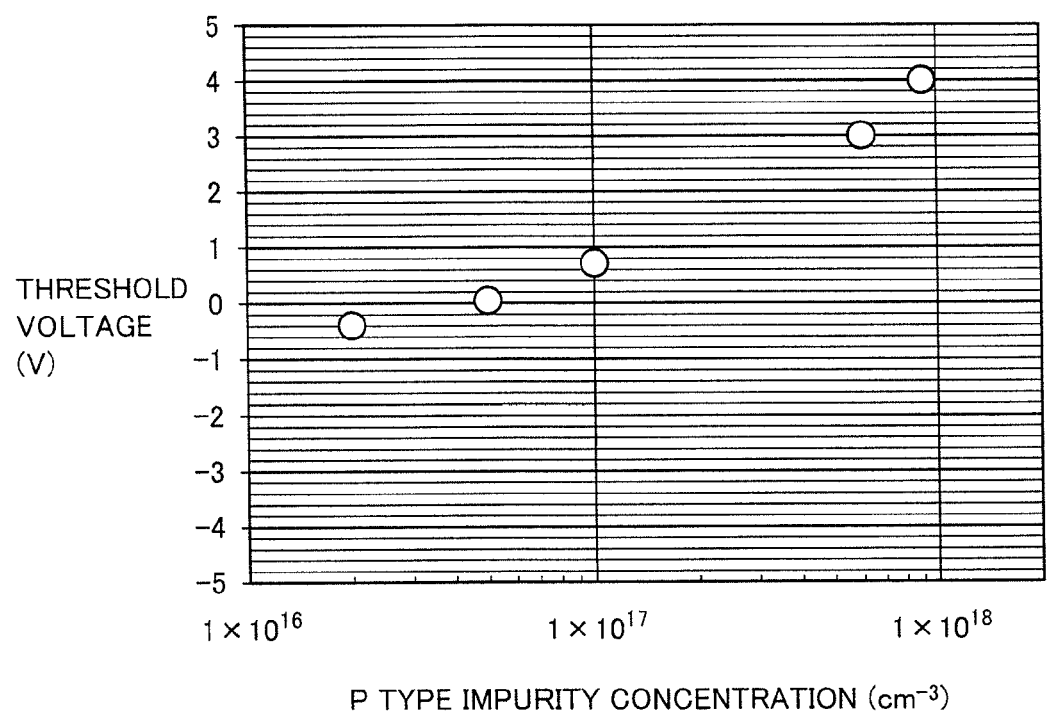
FIG. 32 illustrates the relation between the p type impurity concentration ($cm^{-3}$) in the p body region and the threshold voltage (V) in an IGBT of an example in a sixth example.

Experiments were conducted to examine the relation between p type impurity (Al) concentration ($cm^{-3}$) in a p body region and a threshold voltage (V) in an IGBT of an example. Specifically, first, experimental IGBTs (IGBTs of an example) in which sidewall surfaces of a groove each had a plane orientation of (03-3-8) were fabricated as in the first example. Here, five types of samples of varying p type impurity (Al) concentrations in the p body region were fabricated. Then, a threshold voltage was examined for each of the five types of samples. The results are shown in FIG. 32. In FIG. 32, a horizontal axis represents the p type impurity (Al) concentration ($cm^{-3}$) in the p body region, and a vertical axis represents the threshold voltage (V).

As shown in FIG. 32, it was confirmed that the threshold voltage increased as the p type impurity concentration in the p type body region was increased. It is considered from the results shown in FIG. 32 that the threshold voltage is about 0 to 5 V in a range where the p type impurity concentration in the p body region is $8 \times 10^{16}$ $cm^{-3}$ or more and $3 \times 10^{18}$ $cm^{-3}$ or less.

Further, since the p type impurity concentration in the p body region can be increased while the reduction in channel mobility is suppressed in the IGBTs of the example, as described above, it is considered that sufficient channel mobility can be ensured when the p type impurity concentration in the p body region is about from $8 \times 10^{16}$ $cm^{-3}$ to $3 \times 10^{18}$ $cm^{-3}$.

It was therefore confirmed that the IGBTs of the example could be used in place of a conventional IGBT including silicon as a semiconductor material, by setting the p type impurity concentration in the p body region to $8 \times 10^{16}$ $cm^{-3}$ or more and $3 \times 10^{18}$ $cm^{-3}$ or less, and the IGBTs of the example could be maintained in a normally off type with stability. It is considered that significant reduction in channel mobility resulting from the increase in p type impurity concentration in the p body region can also be avoided.

The present invention can be utilized for an IGBT.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An IGBT comprising:
a silicon carbide substrate of a first conductivity type;
a silicon carbide semiconductor layer of a second conductivity type provided on a main surface of said silicon carbide substrate;
a groove provided in said silicon carbide semiconductor layer;
a body region of the first conductivity type provided in said silicon carbide semiconductor layer; and
an insulating film covering at least a sidewall surface of said groove,
said sidewall surface of said groove being a surface having an off angle of 50° or more and 65° or less with respect to a {0001} plane,
said sidewall surface of said groove including a surface of said body region,
said insulating film being in contact with at least said surface of said body region at said sidewall surface of said groove, and
a first conductivity type impurity concentration in said body region being $5 \times 10^{16}$ $cm^{-3}$ or more.

2. The IGBT according to claim 1, further comprising:
a source region of the second conductivity type provided in said body region, in a region opposite to a side on which said silicon carbide substrate is formed;
a source electrode provided on said source region;
a gate electrode provided on said insulating film; and
a drain electrode provided on said silicon carbide substrate opposite to said main surface, wherein
said sidewall surface of said groove reaches said silicon carbide semiconductor layer,
said sidewall surface of said groove includes said source region, said body region, and said silicon carbide semiconductor layer, and
at least a part of said gate electrode faces said surface of said body region at said sidewall surface of said groove with said insulating film interposed therebetween.

3. The IGBT according to claim 2, wherein
a planar shape of a surface of said source electrode is a stripe shape or a honeycomb shape.

4. The IGBT according to claim 2, wherein
said gate electrode is formed of polysilicon of the first conductivity type or the second conductivity type.

5. The IGBT according to claim 1, wherein
said sidewall surface of said groove has an off angle of $-3°$ or more and 5° or less with respect to a {03-38} plane in a <01-10> direction.

6. The IGBT according to claim 1, wherein
an angle formed between an off orientation of said main surface and a <01-10> direction is 5° or less.

7. The IGBT according to claim 1, wherein
an angle formed between an off orientation of said main surface and a <-2110> direction is 5° or less.

8. The IGBT according to claim 1, wherein
said main surface is a main surface on a carbon face side of silicon carbide forming said silicon carbide substrate.

9. The IGBT according to claim 1, wherein
said first conductivity type impurity concentration in said body region is $1 \times 10^{20}$ cm$^{-3}$ or less.
10. The IGBT according to claim 1, wherein
said first conductivity type impurity concentration in said body region is $8 \times 10^{16}$ cm$^{-3}$ or more and $3 \times 10^{18}$ cm$^{-3}$ or less.
11. The IGBT according to claim 1, wherein
a thickness of said insulating film is 25 nm or more and 70 nm or less.
12. The IGBT according to claim 1, wherein
said first conductivity type is a p type, and said second conductivity type is an n type.
13. The IGBT according to claim 1, wherein
said IGBT is of normally off type.
14. The IGBT according to claim 1, wherein
a threshold voltage at which an inversion layer is formed in said surface of said body region in contact with said insulating film is 2 V or more within a temperature range of 27° C. or more and 100° C. or less.
15. The IGBT according to claim 14, wherein
said threshold voltage is 3 V or more at 100° C.
16. The IGBT according to claim 14, wherein
said threshold voltage is 1 V or more at 200° C.
17. The IGBT according to claim 14, wherein
temperature dependence of said threshold voltage is −10 mV/° C. or more.
18. The IGBT according to claim 1, wherein
channel mobility of electrons at 25° C. is 30 cm$^2$/Vs or more.
19. The IGBT according to claim 1, wherein
channel mobility of electrons at 100° C. is 50 cm$^2$/Vs or more.
20. The IGBT according to claim 1, wherein
channel mobility of electrons at 150° C. is 40 cm$^2$/Vs or more.
21. The IGBT according to claim 1, wherein
temperature dependence of channel mobility of electrons is −0.3 cm$^2$/Vs ° C. or more.
22. The IGBT according to claim 1, wherein
a barrier height at an interface between said body region and said insulating film is 2.2 eV or more and 2.6 eV or less.
23. The IGBT according to claim 1, wherein
in an on state, channel resistance, which is a resistance value of a channel region formed in said body region, is smaller than drift resistance, which is a resistance value of said silicon carbide semiconductor layer other than said channel region.

* * * * *